(12) United States Patent
Kawakita et al.

(10) Patent No.: US 9,449,937 B2
(45) Date of Patent: Sep. 20, 2016

(54) SEMICONDUCTOR DEVICE AND METHOD FOR MANUFACTURING THE SAME

(71) Applicant: Panasonic Intellectual Property Management Co., Ltd., Osaka (JP)

(72) Inventors: Koji Kawakita, Nara (JP); Susumu Sawada, Osaka (JP); Seiichi Nakatani, Osaka (JP); Yoshihisa Yamashita, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/402,221

(22) PCT Filed: Aug. 2, 2013

(86) PCT No.: PCT/JP2013/004704
§ 371 (c)(1),
(2) Date: Nov. 19, 2014

(87) PCT Pub. No.: WO2014/038128
PCT Pub. Date: Mar. 13, 2014

(65) Prior Publication Data
US 2015/0155251 A1  Jun. 4, 2015

(30) Foreign Application Priority Data

Sep. 5, 2012 (JP) .................................. 2012-195161

(51) Int. Cl.
*H01L 23/00* (2006.01)
*H01L 33/64* (2010.01)
(Continued)

(52) U.S. Cl.
CPC ........... *H01L 24/32* (2013.01); *H01L 23/3677* (2013.01); *H01L 23/562* (2013.01);
(Continued)

(58) Field of Classification Search
CPC ... H01L 24/32; H01L 23/562; H01L 33/647; H01L 24/03; H01L 24/05; H01L 24/94; H01L 24/96; H01L 23/3677; H01L 24/27; H01L 24/83; H01L 33/60
See application file for complete search history.

(56) References Cited

U.S. PATENT DOCUMENTS 5,497,033 A   3/1996 Fillion et al.
5,607,779 A   3/1997 Naoi
(Continued)

FOREIGN PATENT DOCUMENTS

JP   11-126863    5/1999
JP   2000-323510  11/2000
(Continued)

OTHER PUBLICATIONS

International Preliminary Report on Patentability and Written Opinion of the International Searching Authority issued Mar. 19, 2015 in International (PCT) Application No. PCT/JP2013/004704.
(Continued)

*Primary Examiner* — Long Pham
(74) *Attorney, Agent, or Firm* — Wenderoth, Lind & Ponack, L.L.P.

(57) ABSTRACT

There is provided a semiconductor device. The semiconductor device of the present invention includes a semiconductor element and a metal buffer layer in an electrical connection to the semiconductor element. The metal buffer layer and the semiconductor element are in a connection with each other by mutual surface contact of the metal buffer layer and the semiconductor element. The metal buffer layer is an external connection terminal used for a mounting with respect to a secondary mount substrate, and the metal buffer layer serves as a buffer part having a stress-relaxation effect between the semiconductor element and the secondary mount substrate.

26 Claims, 28 Drawing Sheets

(51) Int. Cl.
*H01L 23/367* (2006.01)
*H01L 33/60* (2010.01)

(52) U.S. Cl.
CPC .............. *H01L 24/03* (2013.01); *H01L 24/05* (2013.01); *H01L 24/27* (2013.01); *H01L 24/83* (2013.01); *H01L 24/94* (2013.01); *H01L 24/96* (2013.01); *H01L 33/60* (2013.01); *H01L 33/647* (2013.01); H01L 2224/0346 (2013.01); H01L 2224/04042 (2013.01); H01L 2224/04105 (2013.01); H01L 2224/05567 (2013.01); H01L 2224/05639 (2013.01); H01L 2224/05647 (2013.01); H01L 2224/05655 (2013.01); H01L 2224/05664 (2013.01); H01L 2224/05669 (2013.01); H01L 2224/14 (2013.01); H01L 2224/2746 (2013.01); H01L 2224/2784 (2013.01); H01L 2224/3224 (2013.01); H01L 2224/3226 (2013.01); H01L 2224/32113 (2013.01); H01L 2224/45144 (2013.01); H01L 2224/48091 (2013.01); H01L 2224/48639 (2013.01); H01L 2224/48647 (2013.01); H01L 2224/48655 (2013.01); H01L 2224/48664 (2013.01); H01L 2224/48669 (2013.01); H01L 2224/49107 (2013.01); H01L 2224/94 (2013.01); H01L 2224/96 (2013.01); H01L 2224/97 (2013.01); H01L 2924/00014 (2013.01); H01L 2924/12041 (2013.01); H01L 2924/12042 (2013.01); H01L 2924/13055 (2013.01); H01L 2924/15747 (2013.01); H01L 2924/15787 (2013.01); H01L 2924/181 (2013.01); H01L 2924/2064 (2013.01); H01L 2924/2075 (2013.01); H01L 2924/351 (2013.01); H01L 2933/0058 (2013.01); H01L 2933/0066 (2013.01); H01L 2933/0075 (2013.01)

(56) References Cited

U.S. PATENT DOCUMENTS

| | | | |
|---|---|---|---|
| 6,180,263 | B1 | 1/2001 | Naoi |
| 7,202,107 | B2 | 4/2007 | Fuergut et al. |
| 7,927,922 | B2 | 4/2011 | Shen et al. |
| 8,062,537 | B2 | 11/2011 | Tuominen et al. |
| 8,319,246 | B2 | 11/2012 | Sugizaki |
| 2001/0015242 | A1 | 8/2001 | Yao et al. |
| 2003/0021889 | A1 | 1/2003 | Wakizaka |
| 2004/0137661 | A1 | 7/2004 | Murayama |
| 2006/0183269 | A1 | 8/2006 | Fuergut et al. |
| 2007/0015001 | A1 | 1/2007 | Uno et al. |
| 2007/0261234 | A1 | 11/2007 | Song et al. |
| 2007/0267136 | A1 | 11/2007 | Tuominen et al. |
| 2008/0090095 | A1 | 4/2008 | Nagata et al. |
| 2009/0244868 | A1* | 10/2009 | Morita .................. H01L 23/047 361/783 |
| 2009/0314525 | A1 | 12/2009 | Kajino et al. |
| 2010/0139959 | A1 | 6/2010 | Nagao et al. |
| 2010/0320928 | A1 | 12/2010 | Kaihotsu et al. |
| 2011/0073900 | A1 | 3/2011 | Sugizaki |
| 2011/0127070 | A1 | 6/2011 | Ahn et al. |
| 2012/0057339 | A1 | 3/2012 | Mitsuishi et al. |
| 2012/0067611 | A1 | 3/2012 | Kohda |
| 2012/0168206 | A1 | 7/2012 | Sekine et al. |
| 2012/0234584 | A1 | 9/2012 | Ejiri et al. |
| 2012/0244352 | A1 | 9/2012 | Hisano et al. |
| 2012/0255166 | A1 | 10/2012 | Kim et al. |
| 2013/0256884 | A1 | 10/2013 | Meyer |
| 2013/0295407 | A1 | 11/2013 | Obata et al. |
| 2014/0347835 | A1 | 11/2014 | Shimizu et al. |

FOREIGN PATENT DOCUMENTS

| | | |
|---|---|---|
| JP | 2002-170921 | 6/2002 |
| JP | 2003-17757 | 1/2003 |
| JP | 2005-19754 | 1/2005 |
| JP | 2008-42041 | 2/2008 |
| JP | 2008-522396 | 6/2008 |
| JP | 2009-129928 | 6/2009 |
| JP | 2011-71274 | 4/2011 |
| JP | 2012-164956 | 8/2012 |
| WO | 2008/088165 | 7/2008 |

OTHER PUBLICATIONS

International Preliminary Report on Patentability and Written Opinion of the International Searching Authority issued Mar. 12, 2015 in International (PCT) Application No. PCT/JP2013/004706.
International Search Report issued Oct. 15, 2013 in International (PCT) Application No. PCT/JP2013/004704.
International Search Report issued Oct. 8, 2013 in International (PCT) Application No. PCT/JP2013/004706.
Notice of Allowance issued Feb. 25, 2016 in related U.S. Appl. No. 14/397,289.
Corrected Notice of Allowability issued Mar. 17, 2016 in related U.S. Appl. No. 14/397,289.

* cited by examiner

Fig. 18A
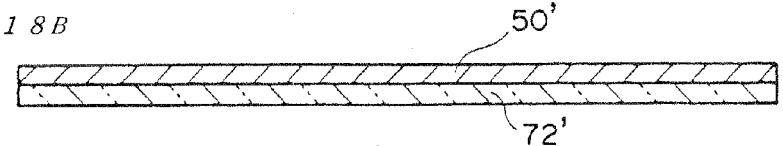
Fig. 18B
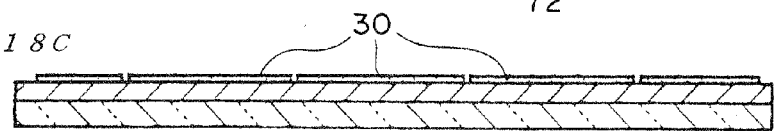
Fig. 18C
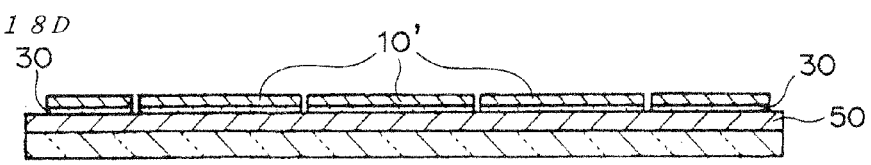
Fig. 18D
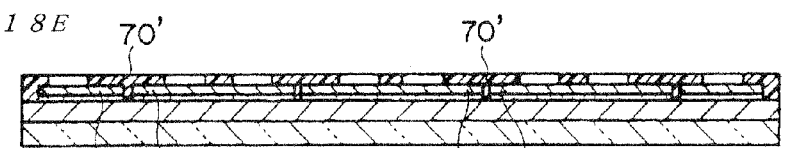
Fig. 18E
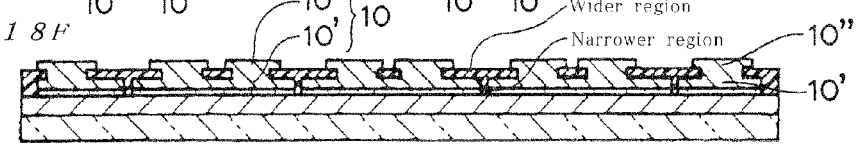
Fig. 18F
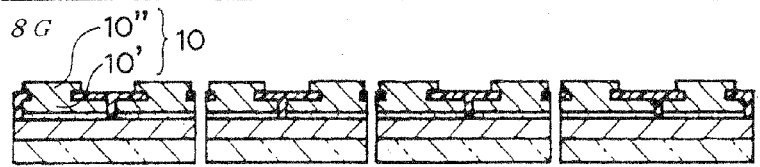
Fig. 18G
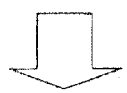
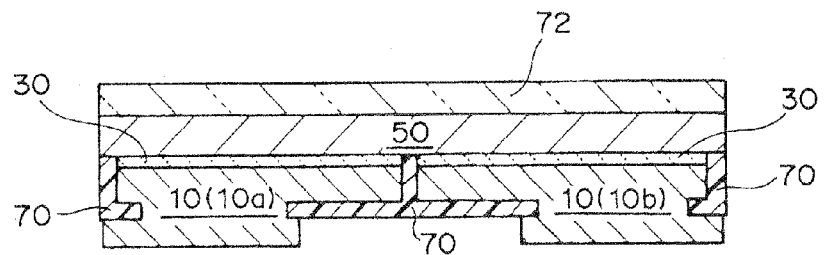

*Fig. 21A*

Patterned formation of insulating layer
(In case where insulating layer raw material is photosensitive material)

(a) Allover formation of insulating layer (Spin coating/Doctor blade)

(b) Exposure (Mask exposure)     UV     Mask for exposure

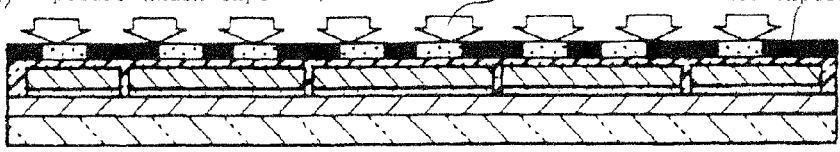

(c) Development                                70'

*Fig. 21B*

Patterned formation of insulating layer
(In case where insulating layer raw material is not photosensitive material)

Patterned printing of insulating layer

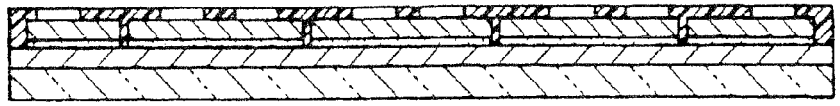

Fig. 22A
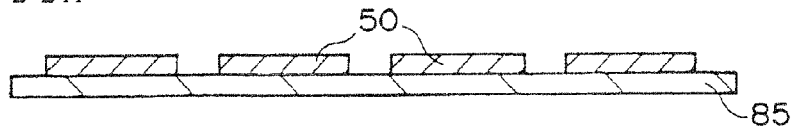
Fig. 22B
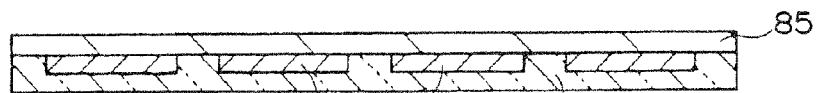
Fig. 22C
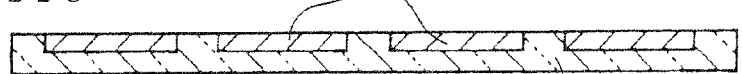
Fig. 22D
Fig. 22E
Fig. 22F
Fig. 22G
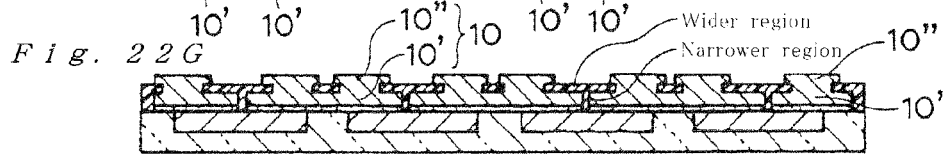
Fig. 22H
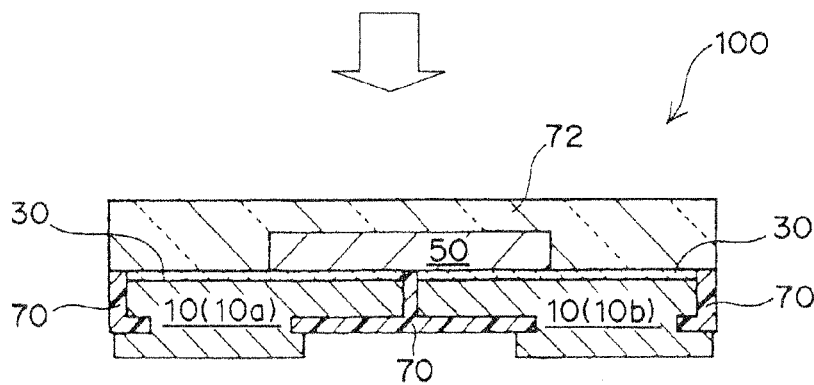

Fig. 23A
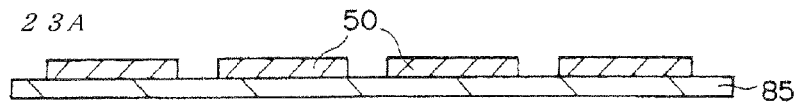
Fig. 23B
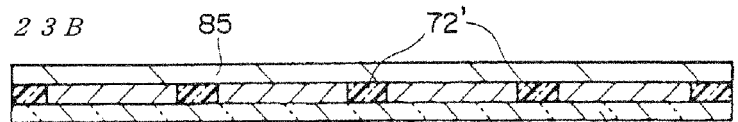
Fig. 23C
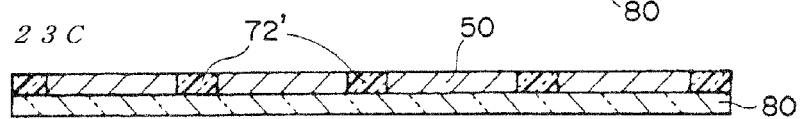
Fig. 23D
Fig. 23E
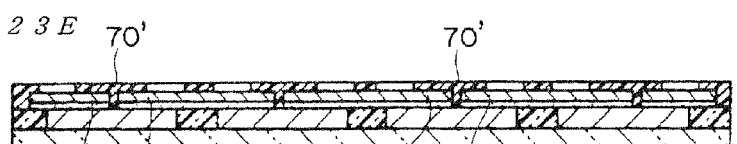
Fig. 23F
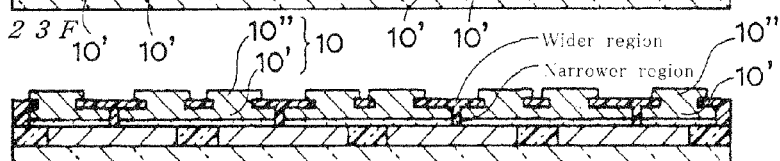
Fig. 23G
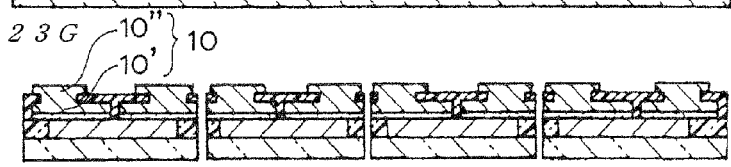
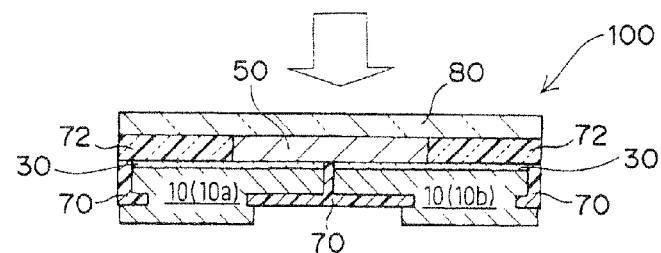
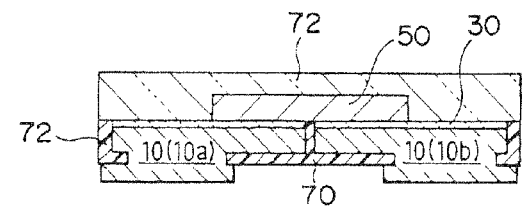

Fig. 24A
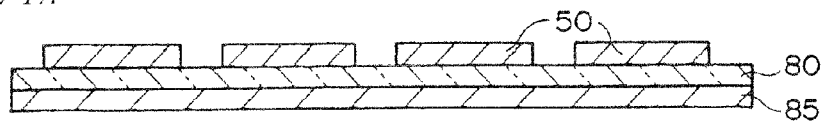
Fig. 24B
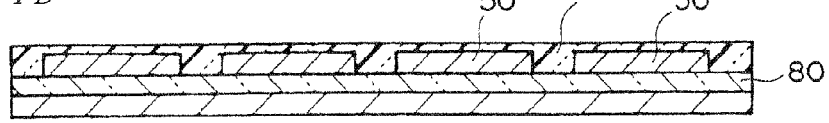
Fig. 24C
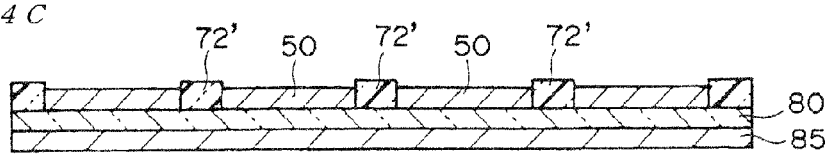
Fig. 24D
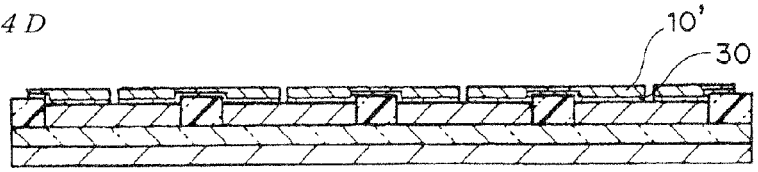
Fig. 24E
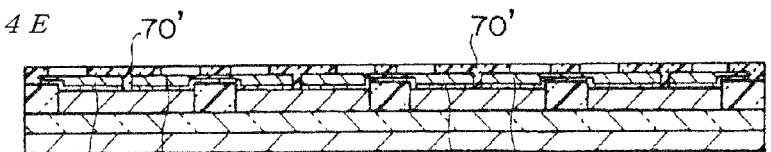
Fig. 24F
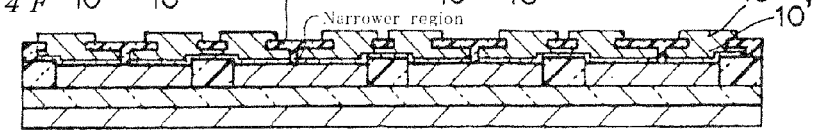
Fig. 24G
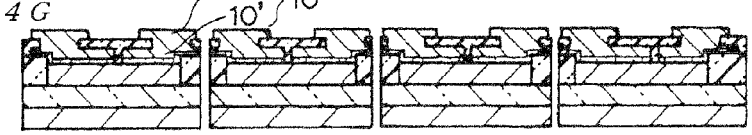
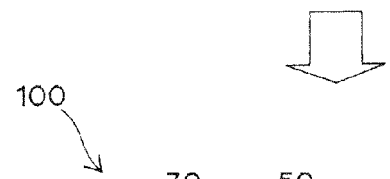
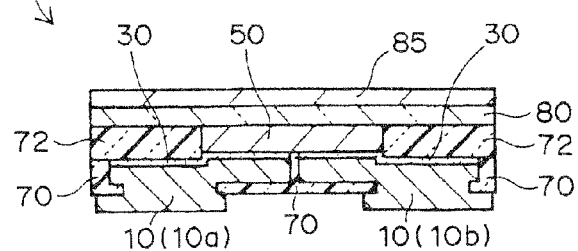

Fig. 26A
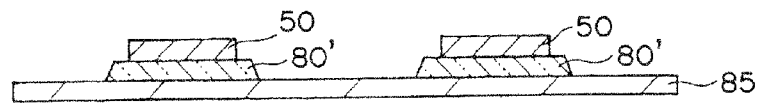
Fig. 26B
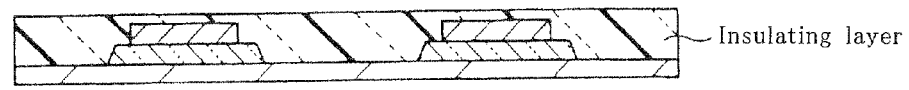
Fig. 26C
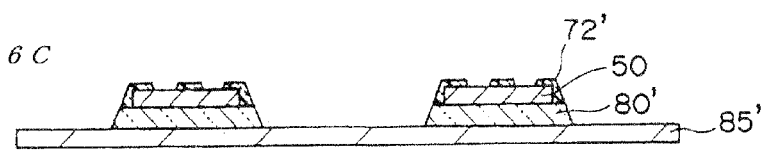
Fig. 26D
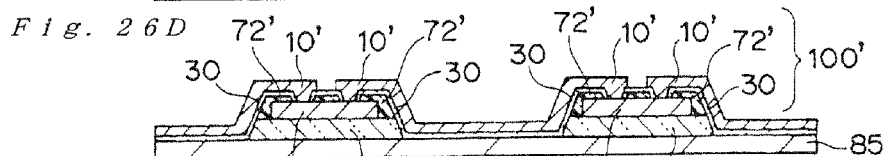
Fig. 26E
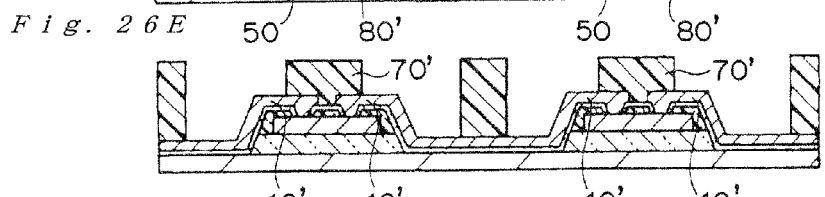
Fig. 26F
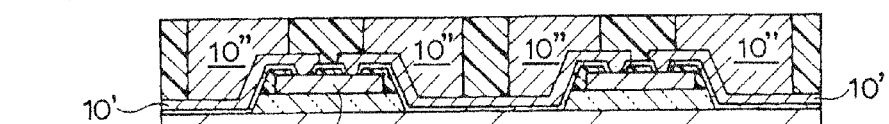
Fig. 26G
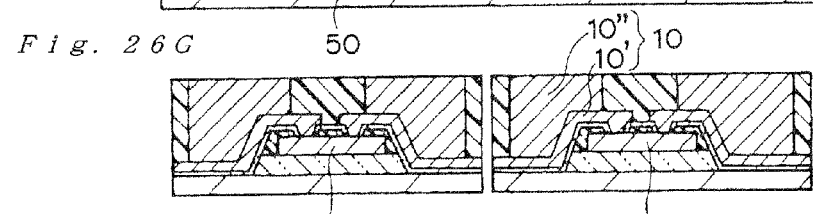
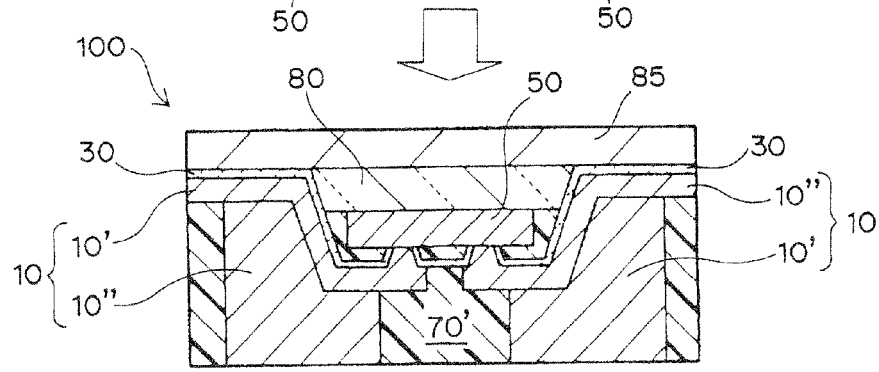

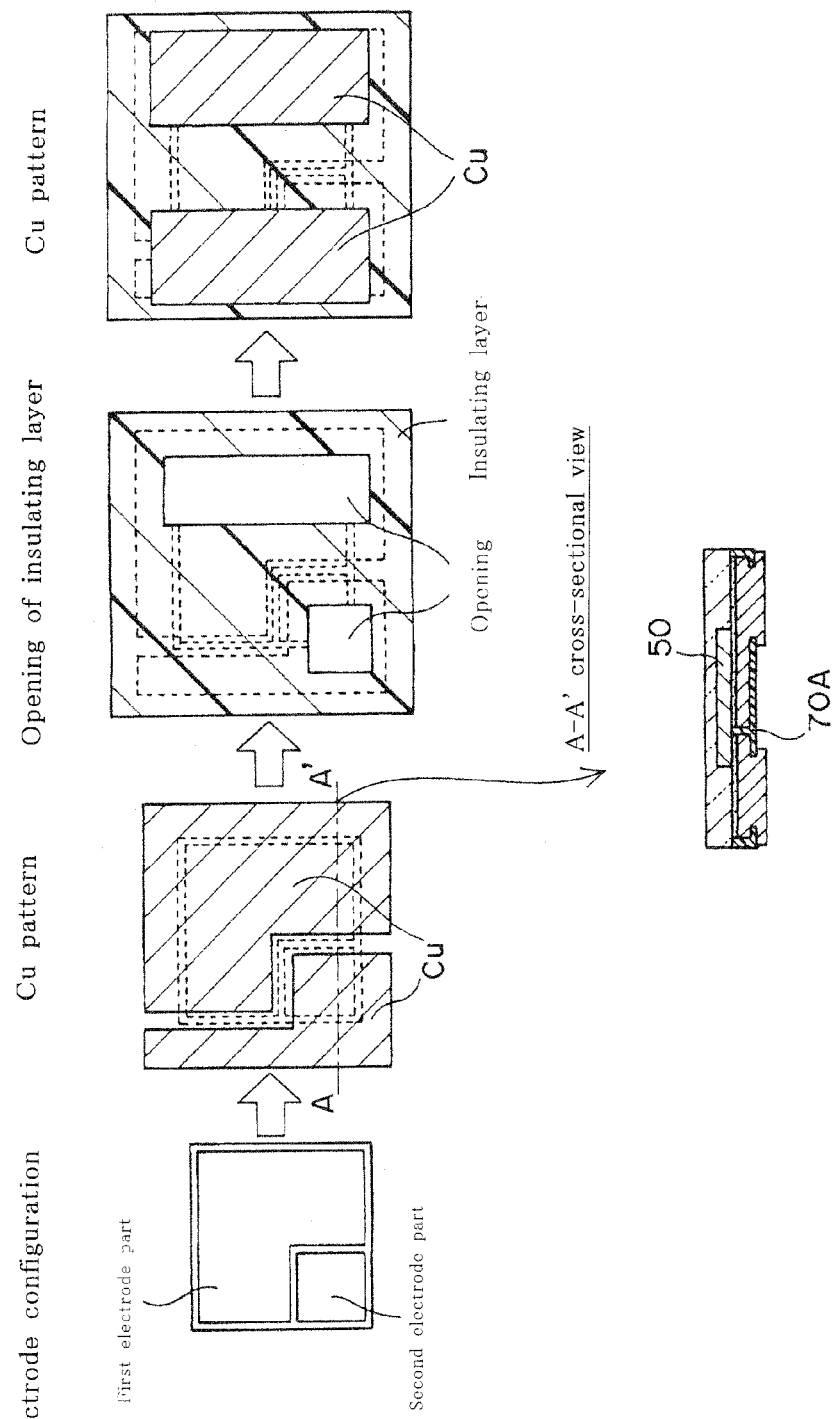

Lower point below central portion of semiconductor element

W/B Type

F/C Type

SEMICONDUCTOR DEVICE AND METHOD FOR MANUFACTURING THE SAME

TECHNICAL FIELD

The present invention relates to a semiconductor device and a method for manufacturing the semiconductor device. More particularly, the present invention relates to a semiconductor device having a satisfactory heat releasing and a high reliability, and also a method for manufacturing such device.

BACKGROUND OF THE INVENTION

In recent years, a semiconductor for controlling a large current has been used in a hybrid automobile equipped with a gasoline engine combined with an electric motor. Such semiconductor has been also used for the purpose of controlling a high-power current with the growth of electric automobiles equipped with the electric motor only as a driving source.

Further, a LED serving as a light source capable of emitting a light has been used in various applications because it is considered as being energy-saving light source with a long lifetime. For example, the LED is used as backlight source for display device (e.g., liquid crystal display). Such LED can also be used in camera flash applications and automotive applications, and also in various lighting applications.

In the motor of the electric automobile as well as the high-brightness LED, the increased current of electricity is applied through the semiconductor. The increased current applied to the motor and the high-brightness LED, however, can be a severe operating condition for them, causing the degraded performance of the semiconductor. Such degradation of the semiconductor inhibits the long lifetime and the high reliability in the large-current controlling semiconductor package and the LED module. For example, when the electric current through the semiconductor is increased, the heat generated in the semiconductor increases. As a result, the temperature tends to rise in the module and a system thereof, which leads to a deterioration of the module and the system. In this regard, the high-efficient GaN and SiC, which are generally used as the high-power controlling semiconductor for the electric motor, has an efficiency of about 98% in which about 2% of the electric current is converted to the heat. This leads to a problem when the semiconductor is used under a sever condition of high power. Furthermore, as for the high-brightness white LED, only about 25% of the electric power to be consumed in the white LED is converted into the visible light and the rest of the electric power is directly converted into the heat. It is therefore required to release the heat from the semiconductor package, and thus various types of heat sinks are used to this end.

PATENT DOCUMENTS

Prior Art Patent Documents

PATENT DOCUMENT 1: JP-A-2009-129928
PATENT DOCUMENT 2: WO 08/088165 A

DISCLOSURE OF THE INVENTION

Problems to be Solved by the Invention

The currently-used semiconductor chip can be classified into two mounting types of "Wire Bonding type (W/B type)" and "Flip Chip type (F/C type)". According to the "Wire Bonding type (W/B type)", an electrode of the semiconductor chip faces upward, and a gold wire is in connection to the upward electrode to ensure an electrical connection of the semiconductor chip (see FIG. 29A). While on the other hand, according to the "Flip-Chip type (F/C type)", an electrode of the semiconductor chip faces downward, and a gold bump is in connection to the downward electrode to ensure an electrical connection of the semiconductor chip (see FIG. 29B).

As a result of extensive studies by the inventors, they have found that the "Flip Chip type (F/C type)" is not necessarily preferable in view of heat releasing because of the gold bump being thermal resistance. More specifically, an area occupied by the gold bumps in the semiconductor chip is small (for example, the occupied area is no more than about 25% of the surface area of the semiconductor chip when estimated at a maximum), and thus the gold bump unfavorably serves as a rate-determining part with respect to the heat dissipation, which leads to an insufficiency of the heat releasing of the device in the flip-chip type. The thermal resistance of the gold bumps implies that the heat can be generated in the area where the gold bumps are provided (i.e., in the mounting area of the device). The "Flip Chip type (F/C type)", even if a substrate with high heat dissipation is used, cannot achieve a high heat-releasing performance of the chip since the transmission of the heat toward the substrate is prevented (see FIG. 29B).

While on the other hand, the "Wire Bonding type (W/B type)" is preferable in terms of the heat-releasing performance since thermal vias can be disposed directly under the semiconductor chip as shown in FIG. 29A. However, it is impossible to ensure a necessary electric current flowing through the wire in a case of the high-power controlling semiconductor. Further, in a case of the high-brightness LED, it is not preferable in terms of the light extraction since the electrodes (bumps) block the light. More specifically, the electrodes on the upper surface of the LED can limit the light extraction area of the LED, and thereby the amount of the light extraction is reduced. Furthermore, the wire itself can block the emitted light in the device of the wire-bonding type, which also reduces the amount of the light extraction.

Moreover, in a case where the semiconductor used in the semiconductor device has a thermal expansion coefficient which is different from that of the surrounding material (during a heat generation proceeds), a stress attributed to such difference therebetween can occur, which may lead to an undesirable phenomenon. In this regard, the reliability of the semiconductor device may be reduced due to the presence of such thermal stress.

The present invention has been created under the above circumstances. In other words, a main object of the present invention is to provide a semiconductor device capable of not only satisfying the both performances of the heat releasing and the light extraction, but also exhibiting a high reliability even under the condition of the heat stress.

Means for Solving the Problem

Rather than addressing as merely extensions of conventional arts, the inventors tried to accomplish the above main object by addressing from a new point of view. As a result, the inventors have created the invention of the semiconductor device capable of achieving the above main object. The present invention provides a semiconductor device including:

a semiconductor element; and a metal buffer layer, the metal buffer layer being in an electrical connection to the semiconductor element, wherein the metal buffer layer and the semiconductor element are in a connection with each other by mutual surface contact of the metal buffer layer and the semiconductor element, and wherein the metal buffer layer is an external connection terminal used for a mounting with respect to a secondary mount substrate, and the metal buffer layer serves as a buffer part having a stress-relaxation effect between the semiconductor device (especially the semiconductor element thereof) and the secondary mount substrate.

One of the features of the semiconductor device according to the present invention is that the metal buffer layer is in the electrical connection with the semiconductor element such that they are connected to each other by the mutual surface contact (especially, mutual "direct bonding"/"surface bonding") thereof, and thereby the metal buffer layer serves as the buffer part exhibiting the stress-relaxation effect between the semiconductor device and the secondary mount substrate, and also the metal buffer layer is provided as the external connection terminal (e.g., external connection terminal land) used for the mounting with respect to the secondary mount substrate.

The term "stress-relaxation effect" used herein substantially means an effect for reducing the stress which may occur in the semiconductor device. By way of example, the stress-relaxation effect can be an effect for reducing the stress which may occur due to the difference between "linear expansion coefficient of semiconductor element" and "linear expansion coefficient of secondary mount substrate".

Furthermore, the present invention also provides a method for manufacturing the semiconductor device as described above. That is, the method is provided for manufacturing a semiconductor device, the method comprising:

(i) providing a semiconductor element; and (ii) forming a metal buffer layer so that the metal buffer layer is in an electrical connection to the semiconductor element, wherein, in the step (ii), the formation of the metal buffer layer is performed through mutual surface contact of the metal buffer layer and the semiconductor element, and wherein the metal buffer layer is an external connection terminal used for a mounting with respect to a secondary mount substrate, and the metal buffer layer serves as a buffer part having a stress-relaxation effect between the semiconductor device (especially the semiconductor element thereof) and the secondary mount substrate.

One of the features of the manufacturing method according to the present invention is that the metal buffer layer is directly formed on the semiconductor element such that the metal buffer layer and the semiconductor element make mutual surface contact (especially, mutual "direct bonding"/"surface bonding") with each other, and thereby providing the stress-relaxation part as the external connection terminal used for the mounting with respect to the secondary mount substrate, the part exhibiting the stress-relaxation effect.

Effect of the Invention

In accordance with the semiconductor device of the present invention, the performances of "heat releasing", "electrical connection" and "high reliability against thermal stress" can be suitably achieved (see FIG. 1). Specifically, "surface contact between the semiconductor element and the metal buffer layer" can result in a wider area occupied by the metal buffer layer in the semiconductor element, which leads to a suitable achievement of "stress-relaxation stress" as well as "high heat-releasing performance" and "electrical connection".

With respect to the "heat-releasing performance" and "electrical connection" according to the present invention, a mounting with a bump is not provided (that is, there is provided a mounting-less/bump-less device), which enables the heat from the semiconductor element to be released effectively via the area of "surface contact of the semiconductor element and the metal buffer layer". In this regard, the metal buffer layer can be made of a material with high thermal conductivity (e.g., copper material), and also can be provided as "buffer layer with its large thickness" and/or "buffer layer with its large size in a width direction thereof". Therefore, the present invention makes it possible to effectively release the heat of the semiconductor element via the metal buffer layer to the outside thereof. It should be noted that a foundation, which can be optionally used for the formation of the metal buffer layer, at least exhibits the thermal conductivity, and also is provided in a very thin form, and thus the thermal resistance of the foundation is negligibly small. Furthermore, "metal buffer layer with its large thickness" and/or "metal buffer layer with its large size in a width direction thereof" is suitable for an application of the current of electricity, especially the large current of electricity. The semiconductor device according to the present invention has such a structure that the semiconductor element is positioned over the metal buffer layer, i.e., a face-down structure where the electrode of the semiconductor element and also the metal buffer layer connected thereto face downward. This means that such an inconvenience that "poorly electrical connection or disconnection" can be avoided.

With respect to the "high reliability against thermal stress", the metal buffer layer can provide such an advantageous effect that the stress, which may occurs in the semiconductor device, can be reduced. In a case where the semiconductor device is in a mounted state on the secondary mount substrate, an inconvenience attributed to the difference in the thermal expansion coefficient can be avoided, the difference being between "thermal expansion coefficient of semiconductor element" and "thermal expansion coefficient of secondary mount substrate". The metal buffer layer according to the present invention can effectively exert the stress-relaxation effect since it is in a form of "surface contact" with the semiconductor element. Especially in a case where a printed circuit board is used as the secondary mount substrate, there is provided a large difference in thermal expansion substrate between the semiconductor and the secondary mount substrate, which causes the significant stress-relaxation effect of the metal buffer layer. Furthermore, the metal buffer layer can be provided by such a simpler process that the metal buffer layer is formed directly on the semiconductor element. The locally changed properties of the metal buffer layer can be achieved between "semiconductor element-sided region" and "secondary mount substrate-sided region" by the simple change of the forming operation with no large change of the process. This means that the inconvenience attributed to the difference in the thermal expansion coefficient can be more suitably avoided.

In a case where the semiconductor element is a light-emitting type element, "light extraction performance" can be suitably achieved according to the present invention. Specifically, the face-down structure according to the present invention makes it possible not only to extract the light effectively from the upper surface of the semiconductor element, but also to use the foundation for the formation of the metal buffer layer as a reflective layer wherein the light from the lower surface of the semiconductor element can be extracted due to the presence of the reflective layer. In this regard, the "reflective layer with high reflectivity" is provided directly under the semiconductor element, and thus the light emitted downward from the semiconductor element can be effectively reflected by the reflective layer, which leads to an effective utilization of the downward-emitted light. That is, the semiconductor device of the present invention has a desirable structure for extracting the light not only from the upper surface of the device but also from the lower surface thereof.

Furthermore, the semiconductor device of the present invention has a "substrate-less structure". In this regard, the metal buffer layer serves as the supporting layer for supporting the semiconductor element in the semiconductor device of the present invention. The substrate-less structure can lead to the downsizing of the device and also contributes to the low cost of the manufacturing. As such, the device of the present invention can have a suitable flexibility, compared to the conventional device with the high heat-releasing substrate (e.g., ceramic substrate) being used therein as a supporting part.

The device of the present invention also has such a suitable structure that it is capable of wiring directly from the semiconductor element and also achieving a form of array, thereby providing a higher degree of design freedom. Moreover, the device of the present invention has a satisfactory stability of the connection due to the "mounting-less/bump-less".

When focusing on the manufacturing method of the present invention, the method has such more simplified processes that the metal buffer layer is formed directly on the semiconductor element. The simplified manufacturing processes can provide the semiconductor device which is capable of satisfying the performances of "heat releasing", "electrical connection" and "high reliability against thermal stress". In addition, the manufacturing method of the present invention provides a variety of advantageous effects. For example, there is provided such an effect that the redistribution of the wiring can be applied directly to the semiconductor element (e.g., a semiconductor chip), an effect that a wafer-sized chip can be positioned arbitrarily, and an effect that the semiconductor can be sealed on a carrier layer (and thus a light-emitting surface can be smooth in a case of the light-emitting semiconductor element), and the like.

Furthermore, when focusing on the manufacturing method of the present invention, the method has such more simplified processes that the metal buffer layer is directly formed on the semiconductor element, and the foundation used for the direct formation of the metal buffer layer is eventually used as the reflective layer of the semiconductor device. The simplified manufacturing processes can provide the light-emitting device which is capable of satisfying the performances of "heat releasing", "electrical connection", "light extraction" and "high reliability against thermal stress".

BRIEF DESCRIPTION OF THE DRAWINGS

FIGS. 2A to 2C are cross-sectional views schematically illustrating configurations of the semiconductor device wherein FIG. 2A shows the configuration of the semiconductor device having a chip size or wafer size according to the present invention (i.e., the semiconductor device in which the entire width size thereof is equal to the width size of the semiconductor element), FIG. 2B shows the configuration of the semiconductor device having a substantially chip-size or substantially wafer-size according to the present invention (i.e., the semiconductor device in which the entire width size thereof is approximately equal to the width size of the semiconductor element), and FIG. 2C shows the configuration of the semiconductor device according to the present invention where the metal buffer layer extends toward the outside of the semiconductor element and beyond the semiconductor element.

FIGS. 18A to 18G are process-cross sectional views schematically illustrating a manufacturing method according to the present invention with respect to "Process Embodiment 1".

FIGS. 21A(a) to 21A(c) are process-cross sectional views schematically illustrating a forming of an insulating layer pattern when raw material for an insulating layer is a photosensitive material.

FIG. 21B is a process-cross sectional view schematically illustrating a forming of an insulating layer pattern when raw material for an insulating layer is not a photosensitive material.

FIGS. 22A to 22H are process-cross sectional views schematically illustrating a manufacturing method according to the present invention with respect to "Process Embodiment 2".

FIGS. 23A to 23G are process-cross sectional views schematically illustrating a manufacturing method according to the present invention with respect to "Process Embodiment 3".

FIGS. 24A to 24G are process-cross sectional views schematically illustrating a manufacturing method according to the present invention with respect to "Process Embodiment 4".

FIGS. 26A to 26G are process-cross sectional views schematically illustrating a manufacturing method according to the present invention with respect to "Process Embodiment 5".

FIG. 27 includes schematic views for explaining a position of a local region 70A of a first insulating part (viewed from a bottom-sided principal surface of a semiconductor element).

DETAILED DESCRIPTION OF THE INVENTION

Figure 1:
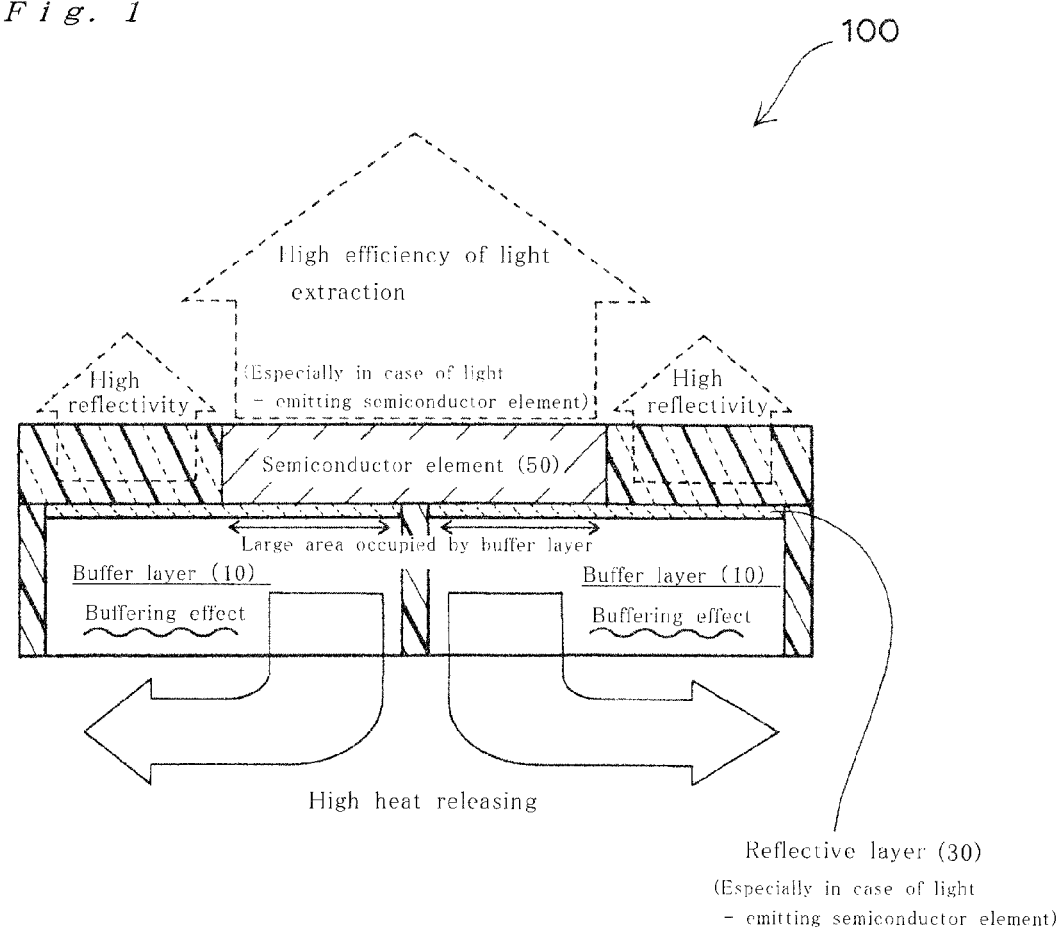
FIG. 1 is a schematic cross-sectional view for explaining functions and effects of the semiconductor device of the present invention.

A semiconductor device and a manufacturing method therefor according to the present invention will be hereinafter described in more detail. It should be noted that various parts or elements are schematically shown in the drawings wherein their dimensional proportions and their appearances are not necessarily real ones, and are merely for the purpose of making it easy to understand the present invention.

[Semiconductor Devices of the Present Invention]

Figure 2A:
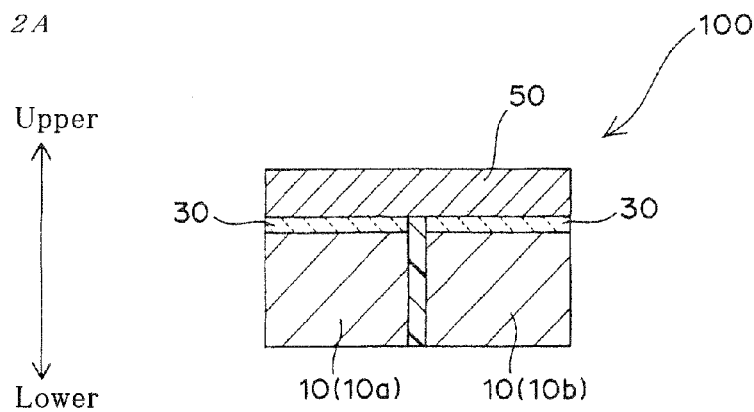
Figure 2B:
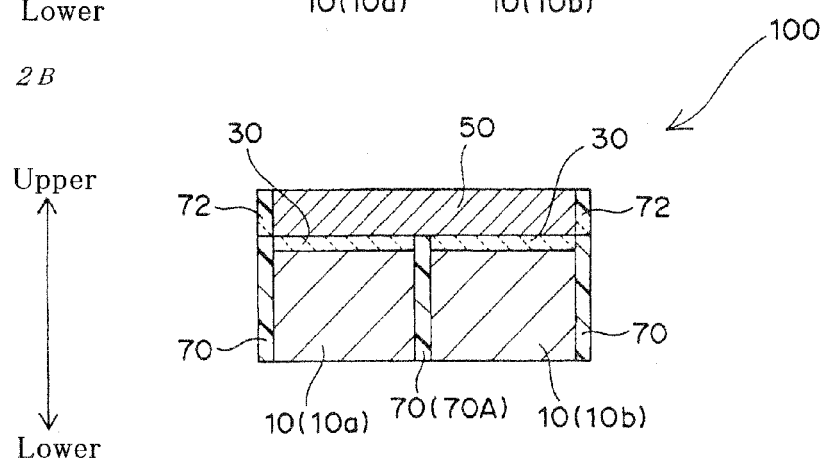
Figure 2C:
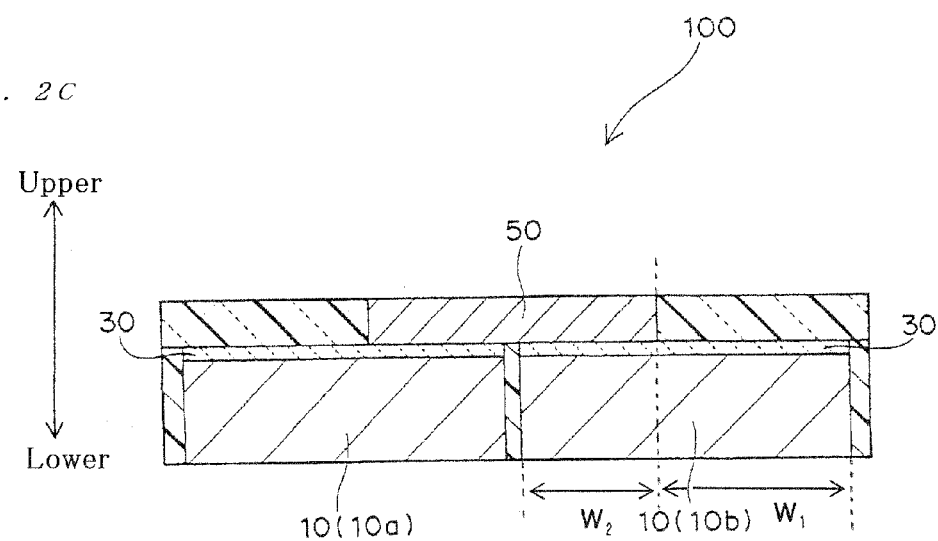

FIGS. 2A-2C schematically illustrate structures of a semiconductor device according to the present invention. As illustrated, the semiconductor device 100 of the present invention comprises a metal buffer layer 10, a foundation 30 for metal buffer layer, and a semiconductor element 50. The semiconductor element 50 is positioned over the metal buffer layer 10, and also the semiconductor element 50 is in contact with at least a part of the foundation 30 on the metal buffer layer. The metal buffer layer 10 is provided as an external connection terminal (e.g., electrode part of the semiconductor element) used for a mounting with respect to a secondary mount substrate, and also the metal buffer layer serves as a buffer part exhibiting a stress-relaxation effect between the semiconductor device and the secondary mount substrate (see FIG. 3).

The term "semiconductor element" used herein substantially means an element capable of controlling the current of electricity or emitting light. Examples of the semiconductor element include a current-controlling element (Si, IGBT, SiC, GaN) or a light-emitting diode (LED) and an electronic component equipped therewith. In this connection, the term "semiconductor element" in the present invention means not only a "bare chip type semiconductor element (i.e., semiconductor chip)" but also a "discrete type semiconductor element wherein a molding of the semiconductor chip is provided". The semiconductor chip may also be not only a current-controlling element, but also a LED chip and a semiconductor laser chip.

The term "secondary mount substrate" used herein substantially means a substrate different from the semiconductor device of the present invention, the substrate being a secondary substrate on which the semiconductor device of the present invention is mounted as a primary substrate. Examples of the secondary mount substrate include a printed circuit substrate (printed wiring board) or a ceramic substrate.

In the semiconductor device 100 of the present invention, the semiconductor element 50 and the metal buffer layer 10 have mutual surface contact (or direct bonding/surface bonding) with each other as illustrated in FIGS. 1, 2A-2C and 3. As such, the semiconductor element 50 and the metal buffer layer 10 are in an electrical connection with each other. The term "surface contact" used herein means an embodiment wherein principal surfaces of respective ones of the part and element are contacted with each other, in particular an embodiment wherein overlapping regions between the principal surfaces of respective ones of the part and element are all contacted with each other. More specifically, the term "surface contact" means an embodiment wherein the overlapping regions between "principal surface of the semiconductor element (i.e., lower principal surface of the element)" and "principal surface of the metal buffer layer (i.e., upper principal surface of the buffer layer)" are all contacted with each other, and more specifically the semiconductor element and the metal buffer layer are in an overlapped relationship with each other via an electrode of the semiconductor element. In other words, the term "surface contact" used herein means an embodiment wherein the mutual overlapping regions of the semiconductor element and the metal buffer layer are all contacted, which corresponds to an embodiment shown in FIG. 4 where "principal surface area "A"" and "principal surface area "B"" are all contacted with each other.

The foundation 30 (more specifically "foundation layer for the provision of the metal buffer layer") positioned between the semiconductor element 50 and the metal buffer layer 10 is such a thin layer that exhibits the negligible thermal resistance or electrical resistance. As such, it can be considered in the present invention that the semiconductor element 50 and the metal buffer layer 10 are in direct surface contact with each other.

The foundation 30 is very thin, whereas the metal buffer layer 10 is thick. The metal buffer layer 10 with such a large thickness suitably functions, substantially as a supporting layer for supporting the semiconductor element 50. That is, the metal buffer layer 10 positioned underneath the semiconductor element 50 is relatively thick and in all surface contact with the semiconductor element 50 in the range of overlapping with the semiconductor element 50, and thereby serving as a platform for supporting the semiconductor element 50. In an embodiment shown in FIG. 2, two buffer layers, i.e., the metal buffer layers 10a and 10b are provided, by way of example. Each of the metal buffer layers 10a and 10b is in surface contact with the semiconductor element 50 in the range of overlapping with the semiconductor element 50, and thus the metal buffer layers 10a and 10b serve suitably as supporting layers for supporting the semiconductor element 50, respectively. The metal buffer layers 10a and 10b, each of which has large thickness, are appropriate for an application of the current therethrough. This means that the metal buffer layers 10a and 10b can be suitably used even in a case of a powder semiconductor.

The number of the metal buffer layer 10 is not limited to "single" and may be "plural". The metal buffer layer 10 is connected to the electrode of the semiconductor element 50, and thus the number of the metal buffer layer 10 may correspond to the number of the electrode of the semiconductor element 50. By way of example, in a case where the semiconductor element is a MOS semiconductor element (e.g., GaN-based semiconductor element), the metal buffer layers 10 are provided to be electrically connected to a source electrode, a drain electrode and a gate electrode, respectively.

The metal buffer layer 10 according to the present invention is provided in a form of thick layer such that it is in the "surface contact" with the semiconductor element 50, and thereby the metal buffer layer 10 is capable of effectively releasing the heat from the semiconductor element via such metal buffer layer to the outside of the element. It is preferred that the metal buffer layer 10 extends to the outer region in the lateral direction/width direction, making it possible to more effectively release the heat from the semiconductor element via such metal buffer layer to the outside of the element. That is, the metal buffer layer 10 functions not only as the supporting layer of the semiconductor device, but also as a heat sink which effectively contributes to the high-heat releasing performance of the semiconductor device. As for a general semiconductor element, when having high temperatures, its efficiency is lowered. In this regard, the semiconductor device of the present invention has the high heat-releasing performance, and thereby achieving the high efficiency and thus the high performance of the device. The semiconductor element 50 according to the present invention may be a power semiconductor. Due to the high heat-releasing performance of the semiconductor device 100, such power semiconductor can be suitably used in the device 100 despite the large amount of heat generation of the power semiconductor. Further, due to the high heat-releasing performance, an operating lifetime of the semiconductor element can be increased, and also degeneration and discoloration of the sealing resin, which are attributed to the heat, can be effectively prevented. Furthermore, the metal buffer layer 10 and the semiconductor element 50 are in the "surface contact" with each other, and thus the electric resistance of the device is more desirable than that of the case wherein they are electrically connected via bump or wire. As such, the present invention enables a larger electric current to be applied in the device. The larger electric current in the metal buffer layer and the semiconductor element can lead to an achievement of not only the higher performance of the device but also the downsizing of the semiconductor element.

A material for the metal buffer layer 10 may be, but is not necessarily limited to, a general material as an electrode material of general semiconductor. For example, at least one metal material selected from the group consisting of copper (Cu), silver (Ag), palladium (Pd), platinum (Pt) and nickel (Ni) can be used as a main material for the metal buffer layer. In a case where "heat releasing performance" is particularly regarded as important factor of the device, it is preferred that the material having high thermal conductivity and contributing effectively to the high heat-releasing performance is used as the material for the metal buffer layer 10. In this regard, copper (Cu) is particularly preferred for the material of the metal buffer layer.

Figure 5:
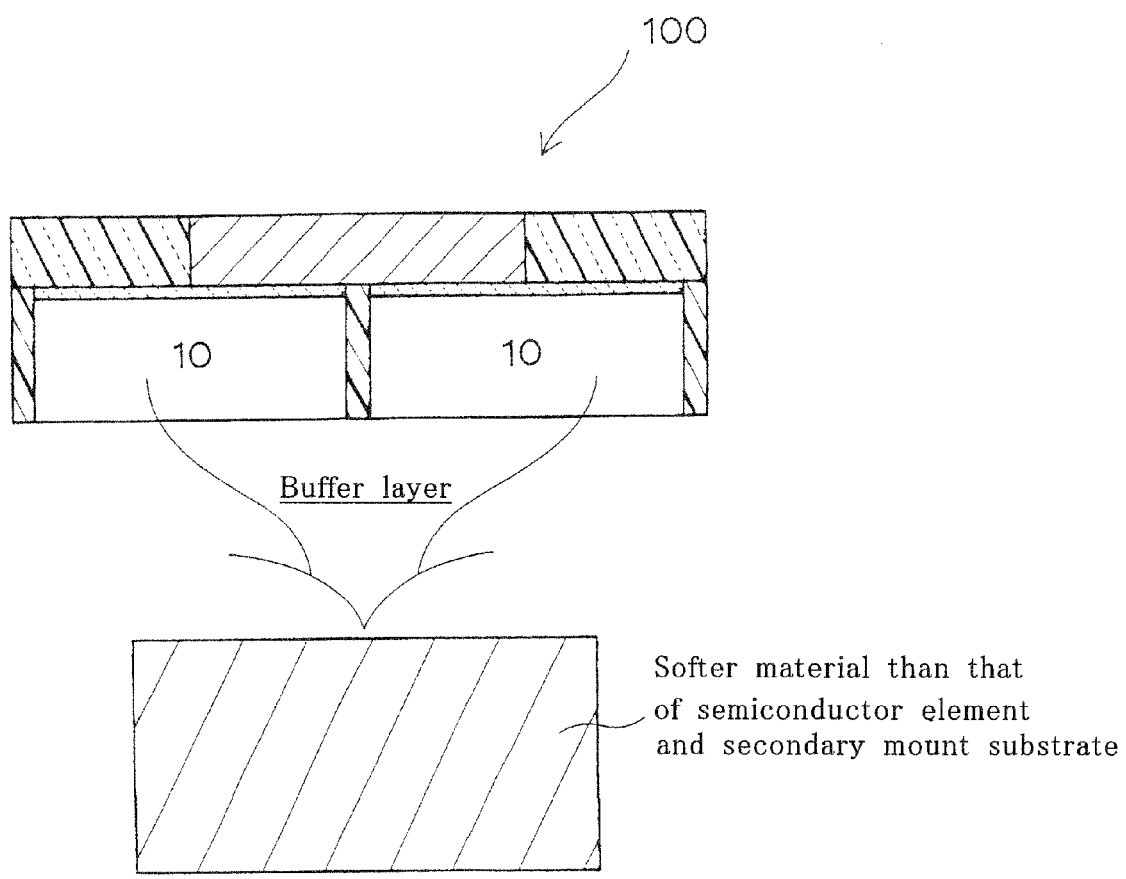
FIG. 5 is a schematic cross-sectional views for explaining an embodiment wherein the metal buffer layer is made of a softer material than that of the semiconductor element and the secondary mount substrate.
Figure 6:
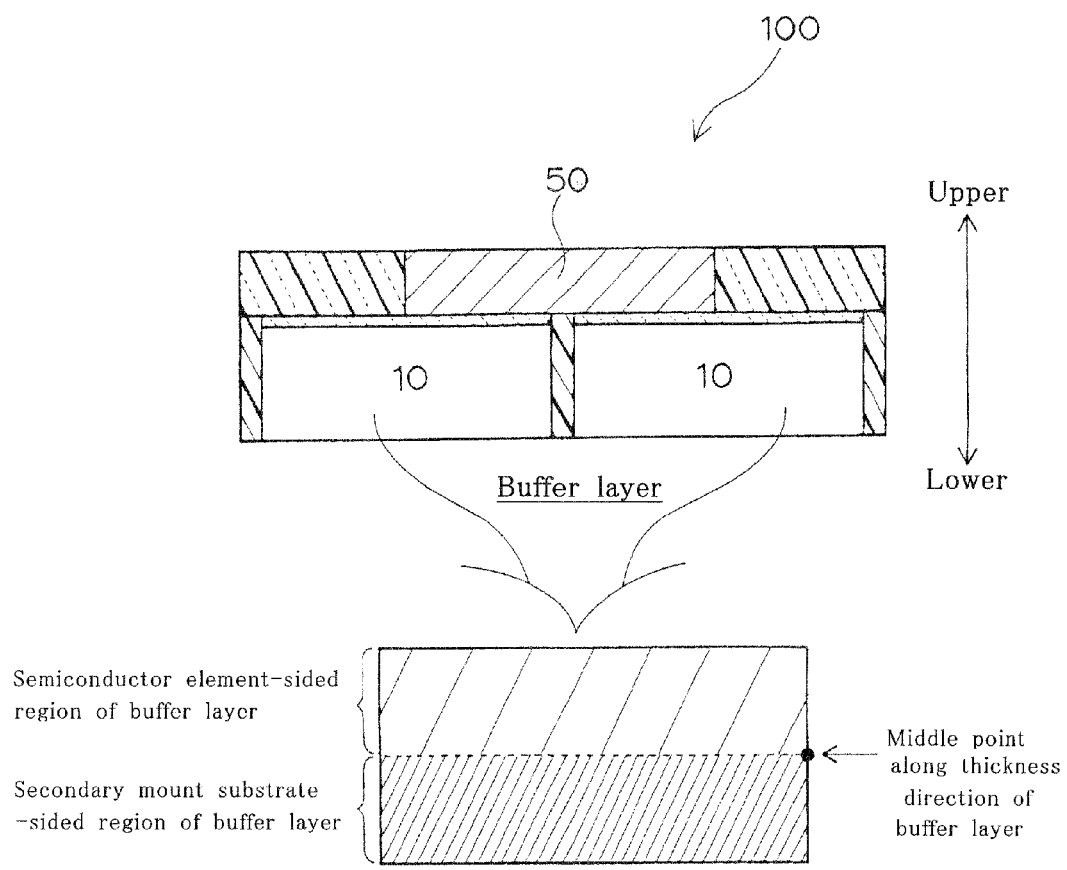
FIG. 6 is a schematic cross-sectional views for explaining an embodiment wherein the metal buffer layer has a locally different material (for example, locally different structure of crystal grain).
Figure 7:
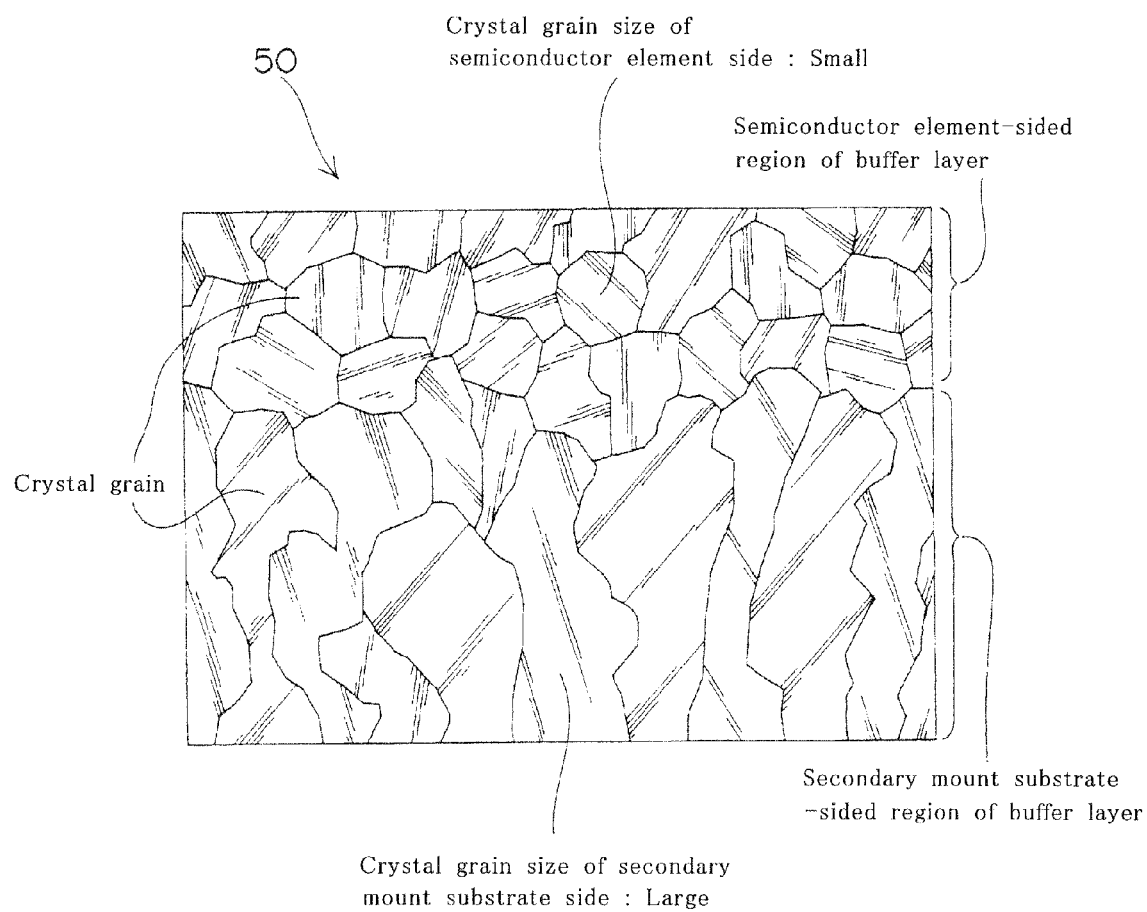
FIG. 7 is a schematic cross-sectional views for explaining an embodiment wherein an average crystal grain size in a semiconductor element-sided region of the metal buffer layer is smaller than that of a secondary mount substrate-sided region of the metal buffer layer.

The metal buffer layer 10 according to the present invention provides "buffer effect", i.e., a stress-relaxation effect in the semiconductor device. For example, as shown in FIG. 5, the metal buffer layer may be made of a softer material. Such material is softer as a whole than respective materials of "semiconductor element" and "secondary mount substrate". As shown in FIG. 6, the metal buffer layer 10 may have a locally different structure of its material. For example, the structure of the material of the metal buffer layer 10 may change along the direction of the thickness of the layer. In particular, it is preferred that the metal buffer layer 10 has a locally different structure of its crystal grain. As shown in FIG. 6, it is preferred in this regard that "crystal structure of semiconductor element-sided region of the metal buffer layer" and "crystal structure of secondary mount substrate-sided region of the metal buffer layer" may be different from each other. For example, as shown in FIG. 7, "average crystal grain size in the semiconductor element-sided region of the metal buffer layer" may be smaller than "average crystal grain size in the secondary mount substrate-sided region of the metal buffer layer." The metal buffer layer 10, which has the locally different structure of its crystal grain, makes it possible to reduce the stress which may occur due to the difference between "thermal expansion (thermal expansion coefficient/linear expansion coefficient) of semiconductor element" and "thermal expansion (thermal expansion coefficient/linear expansion coefficient) of secondary mount substrate" during the heat generation in the semiconductor device (especially "heat generation of the semiconductor element"). This means that the metal buffer layer 10 can improve "thermal reliability" of the semiconductor device. As such, the difference in crystal structure between "local region positioned at the inner side of the buffer layer" and "local region positioned at the outer side of the buffer layer" can not only reduce the difference in the thermal expansion between the semiconductor element and a portion to be connected thereto, but also reduce the difference in the thermal expansion between the secondary mount substrate (e.g., motherboard) and a portion to be connected thereto, which can eventually provide a suitable buffer effect. By way of example, the average crystal grain size in the semiconductor element-sided local region of the metal buffer layer is 5 μm or lower, i.e., in the range of 0 μm (excluding "0 μm") to 5 μm, whereas the average crystal grain size in the secondary mount substrate-sided local region of the metal buffer layer is 10 μm or larger, e.g., in the range of 10 μm to 60 μm.

The term "semiconductor element-sided region of the metal buffer layer" as used herein means a local region of the metal buffer layer, the local region being relatively positioned at the side of the semiconductor element. Referring to FIG. 6 for example, the term "semiconductor element-sided region of the metal buffer layer" means an upper local region which is positioned above the central point/middle point of the metal buffer layer in the direction of the thickness of the layer. While on the other hand, the term "secondary mount substrate-sided region of the metal buffer layer" as used herein means an outer local region of the metal buffer layer, the outer local region being positioned relatively outside. Referring to FIG. 6 for example, the term "secondary mount substrate-sided region of the metal buffer layer" means the outer local region which is positioned below the central point/middle point of the metal buffer layer in the direction of the thickness of the layer. The term "crystal grain size" used herein means that a grain size calculated based on the cross-sectional image taken along the thickness direction of the metal buffer layer, as shown in FIG. 7. For example, the term "crystal grain size" means that a diameter of the circle having the same area as that of the crystal grain obtained from its cross-sectional image, and particularly the diameter calculated as a number average by measuring each grain diameter of 50 grains for example.

Figure 8:
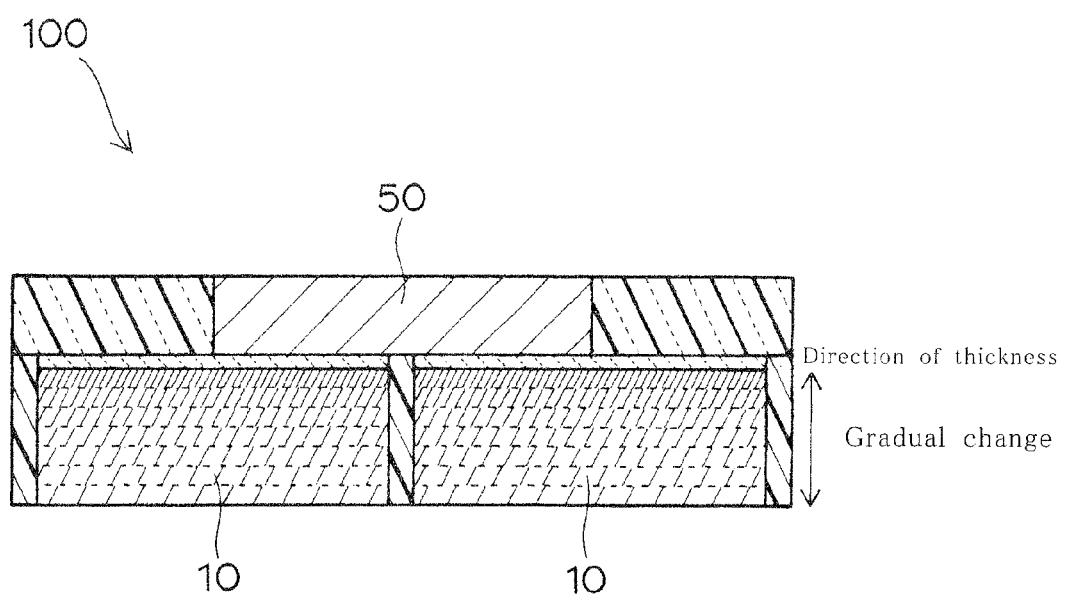
FIG. 8 is a schematic cross-sectional views for explaining an embodiment wherein a material (e.g., crystal structure) of the metal buffer layer gradually changes.

As will be later described, the locally different structure of the crystal grain can be formed by adjusting the composition of the plating solution, or by controlling a plating current in a case of a wet-plating formation of the metal buffer layer 10. The local difference in crystal structure of the metal buffer layer is not necessarily required to be clearly distinguishable. The crystal structure of the metal buffer layer may gradually vary in the thickness direction of the metal buffer layer. In other words, as shown in FIG. 8, the crystal structure of the metal buffer layer may gradually vary from the semiconductor element side of the metal buffer layer to the secondary mount substrate side thereof. This means that the crystal structure of the metal buffer layer may also gradually vary from the secondary mount substrate side of the metal buffer layer to the semiconductor element side thereof in the thickness direction of the metal buffer layer. By way of example, the average crystal grain size gradually becomes larger from the semiconductor element side of the metal buffer layer to the secondary mount substrate side thereof in the thickness direction of the metal buffer layer.

Figure 9:
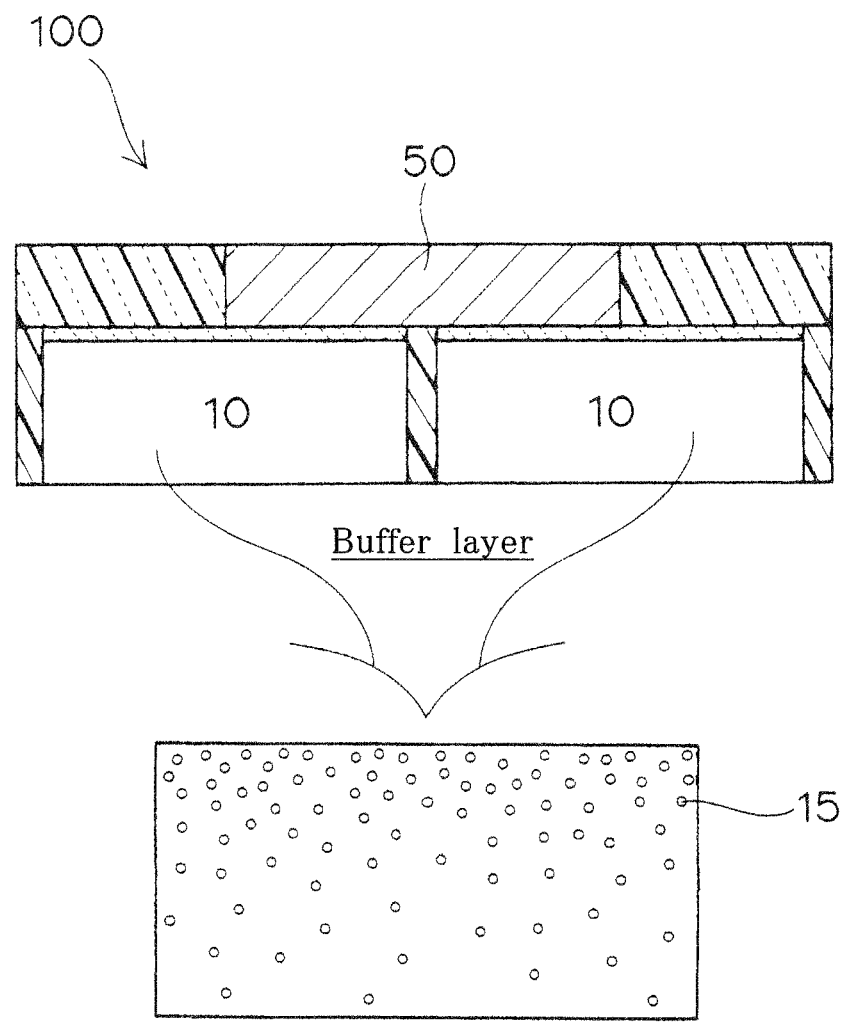
FIG. 9 is a schematic cross-sectional views for explaining an embodiment wherein the metal buffer layer comprises at least one kind of particle in its base material.

The metal buffer layer 10 according to the present invention may comprises at least one kind of particle 15 in its base material, which also can effectively provide the buffer effect (FIG. 9). The containing (or dispersing) of the particle in the metal buffer layer 10 can reduce the stress which may occur due to the difference between "thermal expansion of semiconductor element" and "thermal expansion of secondary mount substrate" during the heat generation in the semiconductor device. For example, the particle contained in the base material of the metal buffer layer may be a metal particle. The metal particle is preferably made of material which is different from the base material of the metal buffer layer. It is preferred in this regard that the metal particle may be mainly made of at least one kind of material selected from the group consisting of Ag (silver), palladium (Pd), Pt (platinum), Ni (nickel) and Cu (copper). Alternatively, the particle contained in the base material of the metal buffer layer 10 is an insulating particle (e.g., insulating particle capable of satisfying thermal expansion and heat-releasing properties). For example, the insulating particle is preferably made of material which is different from the base material of the metal buffer layer. It is preferred in this regard that the insulating particle may be mainly made of at least one kind of material selected from the group consisting of ceramic oxide, silicide and nitride. As for the base material of the metal buffer layer 10, it may be a plating material (e.g., copper plating material). In a case where the metal buffer layer 10 contains the particle, the content of the particle differs locally in the metal buffer layer 10. For example, the content of the particle in the metal buffer layer 10 may vary along the thickness direction of the layer. The locally different content of the particle in the metal buffer layer can reduce the stress which may occur due to the difference between "thermal expansion of semiconductor element" and "thermal expansion of secondary mount substrate" during the heat generation in the semiconductor device (especially "heat generation of semiconductor element"). By way of example, in a case where "linear expansion coefficient of the material of the particle" is closer to "linear expansion coefficient of the material of the semiconductor element" compared to "linear expansion coefficient of the base material of the metal buffer layer", it is preferred that the particle content "a" in the semiconductor element-sided local region of the metal buffer layer is higher than the particle content "b" in the secondary mount substrate-sided local region of the metal buffer layer. For example, the particle content "a" is higher than the particle content "b" at least by 5%, preferably at least by 10%, more preferably at least by 20%. The term "particle content" used herein means the volume percent (parts per hundred) of the particles based on the total volume of the metal buffer layer. In a simplified way, the particle content can be regarded as a rate of the total section area of the particles with respect to the section area of the metal buffer layer, based on the cross-sectional image taken along the thickness direction of the metal buffer layer.

Similarly to the case of "local difference in crystal structure", the local difference in the content of the particle is not necessarily required to be clearly distinguishable in the metal buffer layer. The particle content may gradually vary in the thickness direction of the metal buffer layer. By way of example, the particle content may gradually become lower from the semiconductor element side of the metal buffer layer to the secondary mount substrate side thereof in the thickness direction of the metal buffer layer.

The metal buffer layer 15 according to the present invention has a relatively large thickness, which not only facilitates the provision of the stress-relaxation effect, but also effectively contributes to the supporting function and also the heat sink function in the device. For example, the metal buffer layer 10 is thicker than the foundation 30, and also thicker than the semiconductor element 50. By way of example, the thickness of the metal buffer layer 10 is preferably in the approximate range of 30 μm to 500 μm, more preferably in the approximate range of 35 μm to 250 μm, and still more preferably in the approximate range of 100 μm to 200 μm.

The foundation 30, which is on the surface portion of the metal buffer layer 10, is positioned directly beneath the semiconductor element 50. Therefore, in a case of a light-emitting semiconductor element, the light emitted downward from the semiconductor element 50 can be effectively reflected by the foundation 30 which serves as a reflecting layer. That is, the downward light can be directed to be upward light. This means that the luminous efficiency can be improved by the foundation 30 disposed directly beneath the semiconductor element 50, and thereby the high brightness can be achieved in the semiconductor device. In a case where the metal buffer layer 10 extends in the lateral direction/width direction, the reflective layer is not only located in a lower region of the semiconductor element 50 but also is widely located at a surrounding region thereof. This can lead to an achievement of more desirable luminous efficiency in the device.

The material of the foundation 30 may be, but is not necessarily limited to, at least one metal material selected from the group consisting of Ag (silver), Al (aluminum), Al alloy, Au (gold), Cr (chromium), Ni (nickel), Pt (platinum), Sn (Tin), Cu (copper), W (tungsten), Ti (titanium) and the like, for example. In a case where the use of the foundation as a layer for the formation of the metal buffer layer 10 is particularly regarded as important factor, the foundation 30 is preferably made of a metal material selected from the group consisting of Ti (titanium), Cu (copper), Ni (nickel) and the like. In a case where the high reflection performance is particularly regarded as important factor of the device, the foundation 30 is preferably made of the metal material selected from the group consisting of Ag (silver), Al (aluminum) and the like. It should also be noted that a form of the foundation 30 is not limited to a single layer form and may be a stacked-layers form. For example, the foundation 30 may be composed of a Ti thin film layer and a Cu thin film layer. In this case, the Ti thin film layer corresponds to "upper layer" whereas the Cu thin film layer corresponds to "lower layer" in the figures (based on the vertical direction shown in FIG. 2, for example).

As for the "direct surface contact between the semiconductor element and the metal buffer layer", the foundation 30 is very thin enough to have a substantially negligible thermal resistance or electrical resistance, and thus may have thickness of nano-order, for example. By way of example, the foundation 30 has very small thickness of 100 nm to 500 nm (or thickness in the approximate range of 100 nm to 300 nm depending on the kind of the material of the foundation serving as the reflective layer), and thus the foundation 30 can be regarded as the thin film layer in the device. Due to the fact that the very thinness of the foundation 30, the semiconductor element 50 and the metal buffer layer 10 can be regarded as being in direct contact with each other in the present invention.

The semiconductor element 50 of the present invention may be not only a "bare chip type semiconductor element (i.e., semiconductor chip)" but also a "discrete type semiconductor element wherein a molding of the semiconductor chip is provided". The semiconductor chip may be one used in a general semiconductor package, and thus it can be suitably selected according to the use application of the semiconductor package. The number of the semiconductor element 50 is not limited to "single" and may be "plural". That is, the semiconductor device 100 of the present invention can be realized not only in a form of "single-chip" as shown in FIG. 2, but also in a form of "multi-chip".

The semiconductor device 100 of the present invention has the "surface contact between the semiconductor element 50 and the metal buffer layer 10", and thereby the heat from the semiconductor element 50 can be suitably released. In other words, the area occupied by the metal buffer layer 10 in the principal surface of the semiconductor element 50 is larger due to the direct bonding/direct surface bonding, and thus the higher heat-releasing performance can be achieved. For example, the ratio of the area occupied by the metal buffer layer 10 (i.e., the ratio of the area occupied by all the metal buffer layers in a case where a plurality of the metal buffer layers are provided) on the lower principal surface of the semiconductor element 50 is 40% or more, preferably in the range of 50% to 90%, more preferably in the range of 70% to 90%. As such, the occupied area by the metal buffer layer is larger due to the "surface contact", and thereby the thermal resistance of the "connecting portion between the semiconductor element and the metal buffer layer" is not a rate-limiting factor in terms of thermal resistance of the whole device according to the present invention, which leads to an achievement of the higher heat-releasing performance. Furthermore, the thickness of the metal buffer layer is larger according to the present invention, which can also improve the heat-releasing performance, and also can facilitate the provision of the buffering effect upon the thermal shock. In other words, the mounting of the semiconductor element, for example, via the bump is not performed in the present invention, and instead the thick buffer layer is in direct contact with the semiconductor element, and thereby achieving the higher heat-releasing performance.

Figure 10:
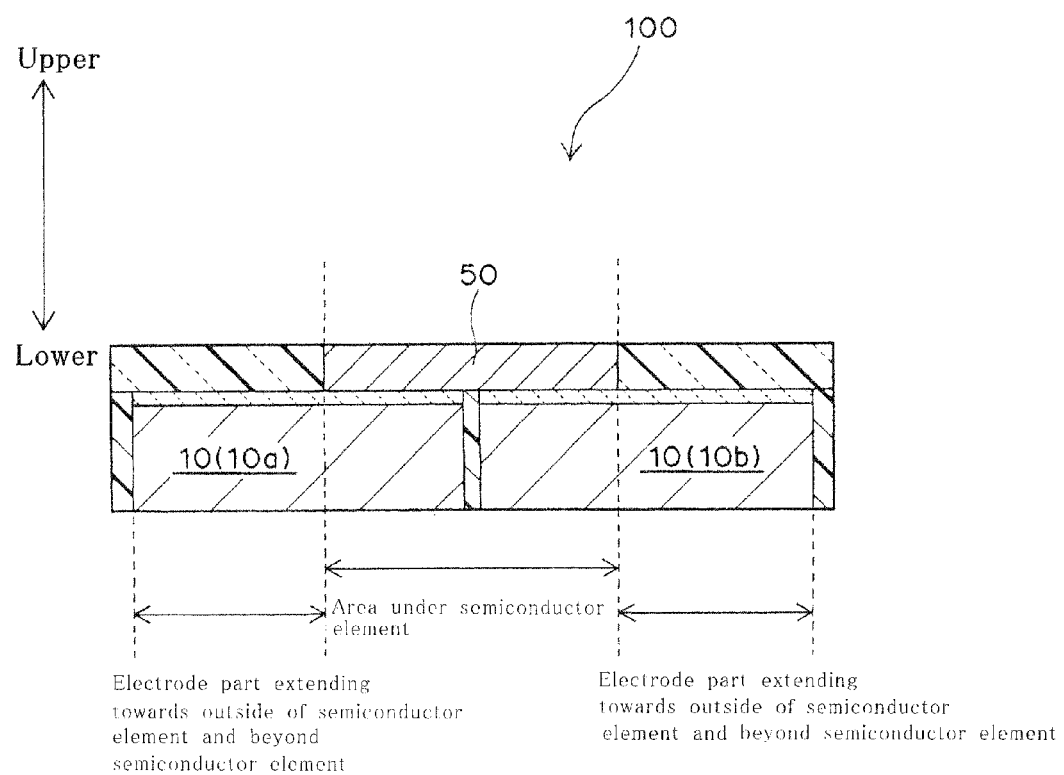
FIG. 10 is a schematic cross-sectional view for explaining an embodiment of "metal buffer layer being directly provided on the semiconductor element" according to the present invention wherein the metal buffer layer laterally extends toward the outside of the semiconductor element so that the metal buffer layer extends beyond the semiconductor element.

It is preferred that the metal buffer layer 10 has a larger size in a width direction thereof in order to achieve the higher heat releasing performance and/or the higher supporting function in the device. In particular, it is preferred as shown in FIG. 10 that the metal buffer layers (10a, 10b) extend toward the outside of the semiconductor element 50 so that the metal buffer layers extend beyond the semiconductor element 50. In other words, it is preferred that each of the metal buffer layers 10a, 10b is not only located in a lower region of the semiconductor element 50 but also extends to an outer region of the lower region in a lateral direction/width direction of the device. In the metal buffer layer 10 with the above preferred form, the supporting function for supporting the semiconductor element 50 is further improved in the device. Furthermore, the metal buffer layer 10 extending in the lateral direction/width direction makes it possible to dissipate the heat from the semiconductor element 50 not only in the downward direction but also in the horizontal direction, which leads to a reduction of the heat resistance as a whole of the device. The metal buffer layer 10 extending in the lateral direction/width direction also makes it possible to more suitably provide a stress-relaxation effect. If the metal buffer layer unnecessarily extends to the outer region, the downsizing of the device may be inhibited. Therefore, the dimension of the portion of the metal buffer layer, which portion extending to the outer region, may be appropriately determined in the consideration of the balancing of "supporting function/heat releasing performance", "stress-relaxation effect" and "downsizing". By way of example, more than half of the width dimension of the metal buffer layer may be positioned in the outer region beyond the semiconductor element. Taking an example of the metal buffer layer shown in FIG. 2C, "width W1 of the buffer portion positioned in the outer region" may be equal to or larger than "width W2 of the buffer portion positioned underneath the semiconductor element".

Figure 11A:
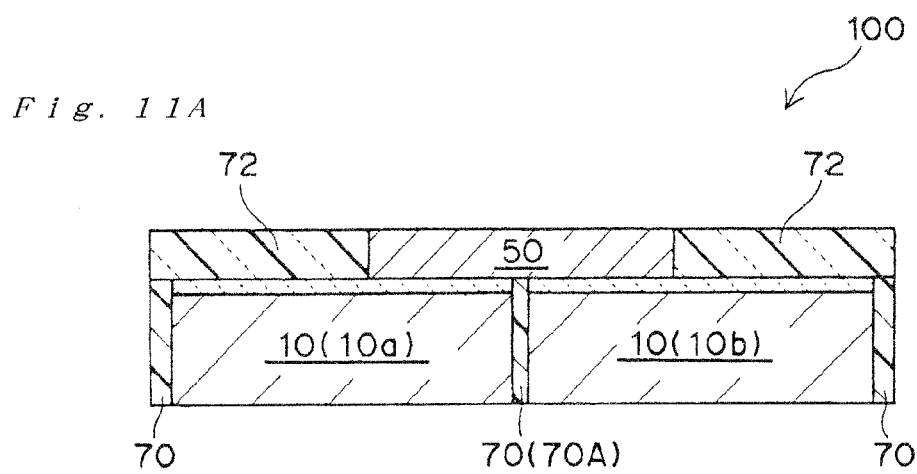
FIGS. 11A to 11C are schematic cross-sectional views for explaining "insulating part" according to the present invention.
Figure 11B:
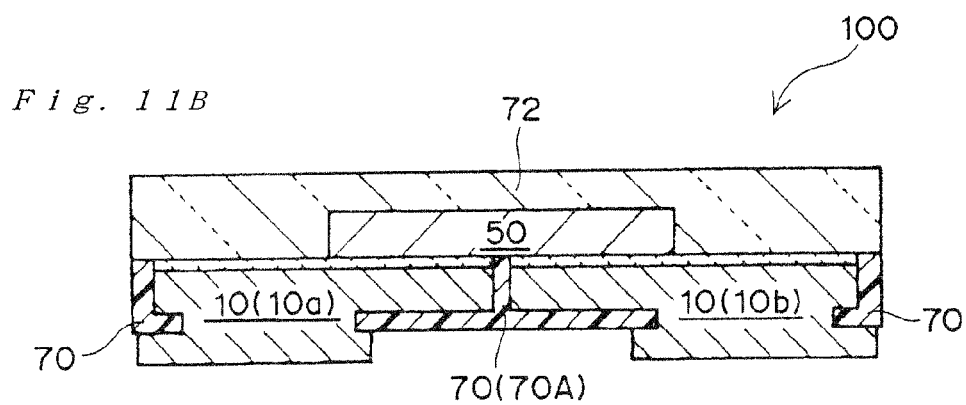
Figure 11C:
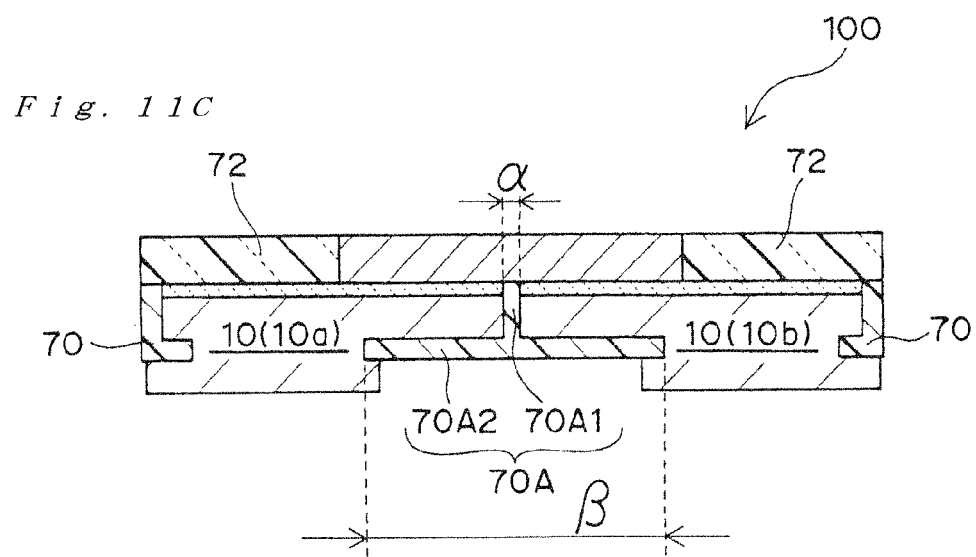

According to the present invention, an insulating part is preferably provided in the semiconductor device. Specifically, it is preferred as shown in FIGS. 11A-11C that a first insulating part 70 is provided around the metal buffer layer 10, whereas a second insulating part 72 is provided around the semiconductor element 50. As seen from the illustration of FIGS. 11A-11C wherein the first insulating part 70 is provided, the metal buffer layer 10 along with the first insulating part 70 serves as the supporting layer in the device. The first insulating part 70 is provided between the metal buffer layers 10a and 10b to ensure an insulation between the metal buffer layers 10a and 10b. On the other hand, as seen from the illustration of FIGS. 11A-11C, the second insulating part 72 can serve as a sealing layer/sealing part for protecting or isolating the semiconductor element 50 from the outside environment, as well as serve as the supporting layer (see FIG. 11B in particular).

Materials for the first insulating part 70 and the second insulating part 72 may be any suitable kinds of insulating materials. For example, the first insulating part 70 and the second insulating part 72a may be made of resin material. More specifically, the resin materials may be an epoxy-based resin or a silicone-based resin. It is preferred that the second insulating part 72 is made of a transparent resin in view of the light extraction. As such, the second insulating parts 72 may be preferably made of a transparent epoxy resin or a transparent silicone resin, for example. Furthermore, in view of light resistance and heat resistance, the material for the first and second insulating parts may be a hybrid material of organic material and/or inorganic material, or an inorganic material only, for example. For example, the material for the first insulating part 70 and the second insulating part 72 may be a sealing material of inorganic glass or the like.

As shown in FIGS. 11A and 11B, it is preferred that the first insulating part 70 is provided between the metal buffer layers 10a and 10b and also in the periphery of the metal buffer layers to be in contact with such buffer layers. It is also preferred that the thickness of the first insulating part 70 may be approximately the same as the thickness of each of the metal buffer layers. In a preferred embodiment, the first insulating part 70 may be provided such that the upper surface of the first insulating part is flush with the upper surface of the foundation 30 (see FIGS. 11A and 11B). It is also preferred as shown in FIGS. 11A and 11B that the second insulating part 72 is provided such that it surrounds the semiconductor element 50 in contact with the semiconductor element 50. The thickness of the second insulating part 72 may be approximately the same as the thickness of each of the metal buffer layers.

In a case of the light-emitting semiconductor element, a phosphor layer 80 may be additionally provided as described later. In this case, the second insulating part 72 may be provided such that its upper surface is flush with the upper surface of the semiconductor element 30 (see FIG. 11A). In a case where the second insulating part 72 additionally serves as a phosphor layer (i.e., in a case where the second insulating part 72 is made of not only a resin material and/or an inorganic material but also a phosphor material), the second insulation part 72 can be thick enough to surround the semiconductor element 30 (see FIG. 11B).

The semiconductor device of the present invention can also be characterized by "fine insulating film". More specifically, "local first insulating part 70A" provided between the metal buffer layers 10a and 10b is composed of two portions of "narrower region 70A1" and "wider region 70A2", as shown in FIG. 11C. This makes it possible to prevent a short circuit between the metal buffer layers 10a and 10b, while rending the thickness of the metal buffer layers large, which can contribute to the achievement of more desired stress-relaxation effect as well as large current and high heat-releasing. That is, the occupied area by the metal buffer layers is larger because of the "surface contact", which may trigger a short circuit due to the short distance between the metal buffer layers 10a and 10b. However, the wider region 70A2 according to the present invention can suitably prevents such short circuit in the device. That is, the wider region 70A2 of the first insulating part 70A serves to lengthen the distance between the metal buffer layers 10a and 10b, thereby preventing the short circuit. By way of example, the width dimension "α" (see FIG. 11C) of the narrower region 70A1 is in the approximate range of 20 μm to 70 μm, whereas the width dimension "β" (see FIG. 11C) of the wider region 70A2 may be 100 μm or larger. It should be note that the upper limit of the width dimension of the wider region may be, but is not necessarily limited to, about 500 μm.

Figure 12A:
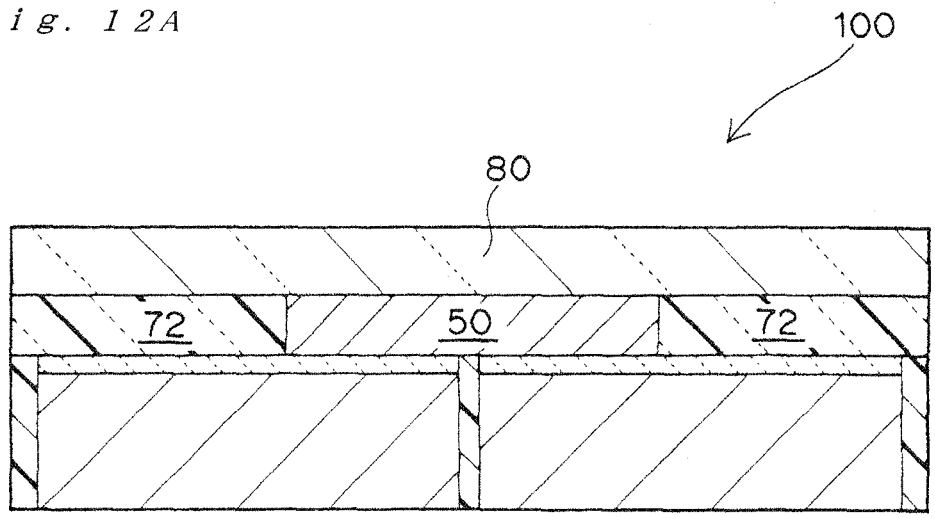
FIGS. 12A to 12B are schematic cross-sectional views for explaining "phosphor layer" provided in the device according to the present invention.
Figure 12B:
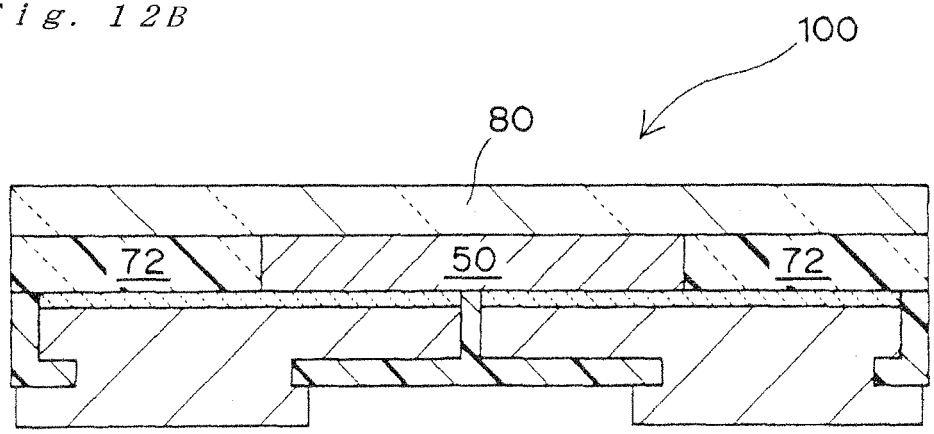

In the case of the light-emitting semiconductor element, the phosphor layer may be provided as needed. For example, as shown in FIGS. 12A and 12B, the phosphor layer 80 may be provided on the second insulating part 72. More specifically, as illustrated in FIGS. 12A and 12B, the phosphor layer 80 may be provided on the second insulating part 72 such that the phosphor layer 80 covers the upper principal surface of the semiconductor element 50. The material for the phosphor layer 80 is not particularly limited as long as it can generate a desired light when receiving the light from the semiconductor element 50. That is, the kind of the phosphor in the phosphor layer 80 may be determined in view of light/electromagnetic-wave emitted from the semiconductor element 50. For example in a case where the semiconductor device is used as a white-light LED package for lighting application, a bright white light can be provided by the phosphor layer 80 with its phosphor material capable of producing yellow colors when receiving blue light emitted from the semiconductor element 50. Furthermore, in a case where the electromagnetic wave emitted from the semiconductor element 50 is ultraviolet (UV), a phosphor material capable of directly producing a white light on receiving the UV may also be used. In a case where the second insulating part 72 is made of not only an insulating material (e.g., a resin material and/or an inorganic material) but also a phosphor material, the second insulating part 72 can have not only the sealing function for the semiconductor element, but also a fluorescent function serving as a fluorescent layer. This makes it unnecessary to provide phosphor layer 80 separately in the device.

Figure 13A:
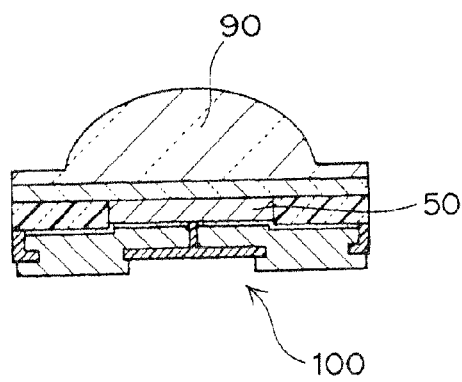
FIGS. 13A to 13B are schematic cross-sectional views for explaining "lens part" provided in the device according to the present invention.
Figure 13B:
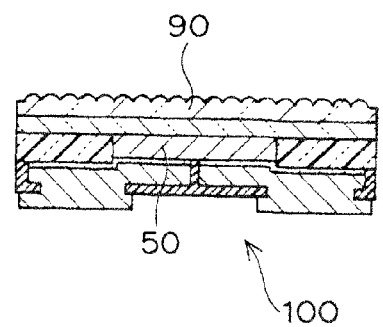

The semiconductor device 100 of the present invention can also be embodied as "device exhibiting light directivity" or "device exhibiting no light directivity", in the case of the light-emitting semiconductor element. It is preferred that the device capable of exhibiting the light directivity comprises a lens part 90 as shown in FIGS. 13A and 13B, for example. As illustrated, a lens-shaped portion of the part 90 is not limited to "single" (as shown in FIG. 13A), but may be "multiple" (as shown in FIG. 13B). The second insulating part 72 and/or the phosphor layer 80 may have lens shape.

Figure 3:
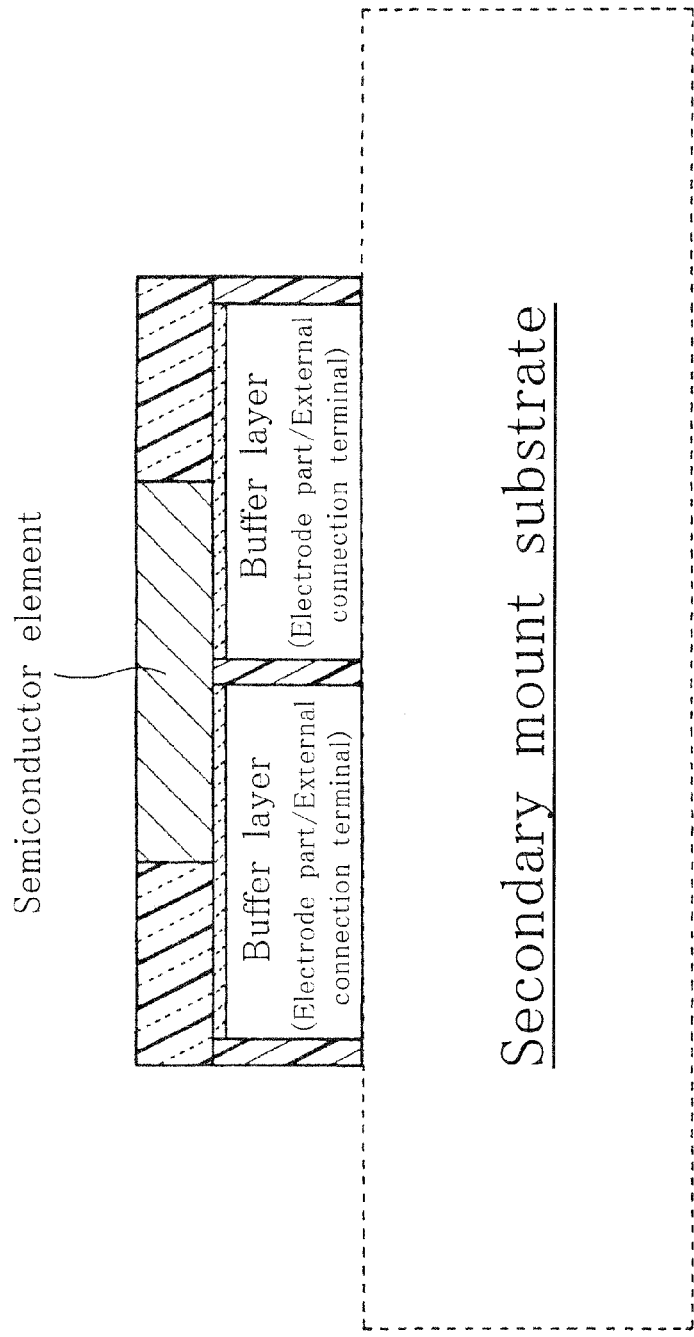
FIG. 3 is a cross sectional view schematically illustrating the relationship of the semiconductor device according to the present invention with respect to the secondary mount substrate.
Figure 4:
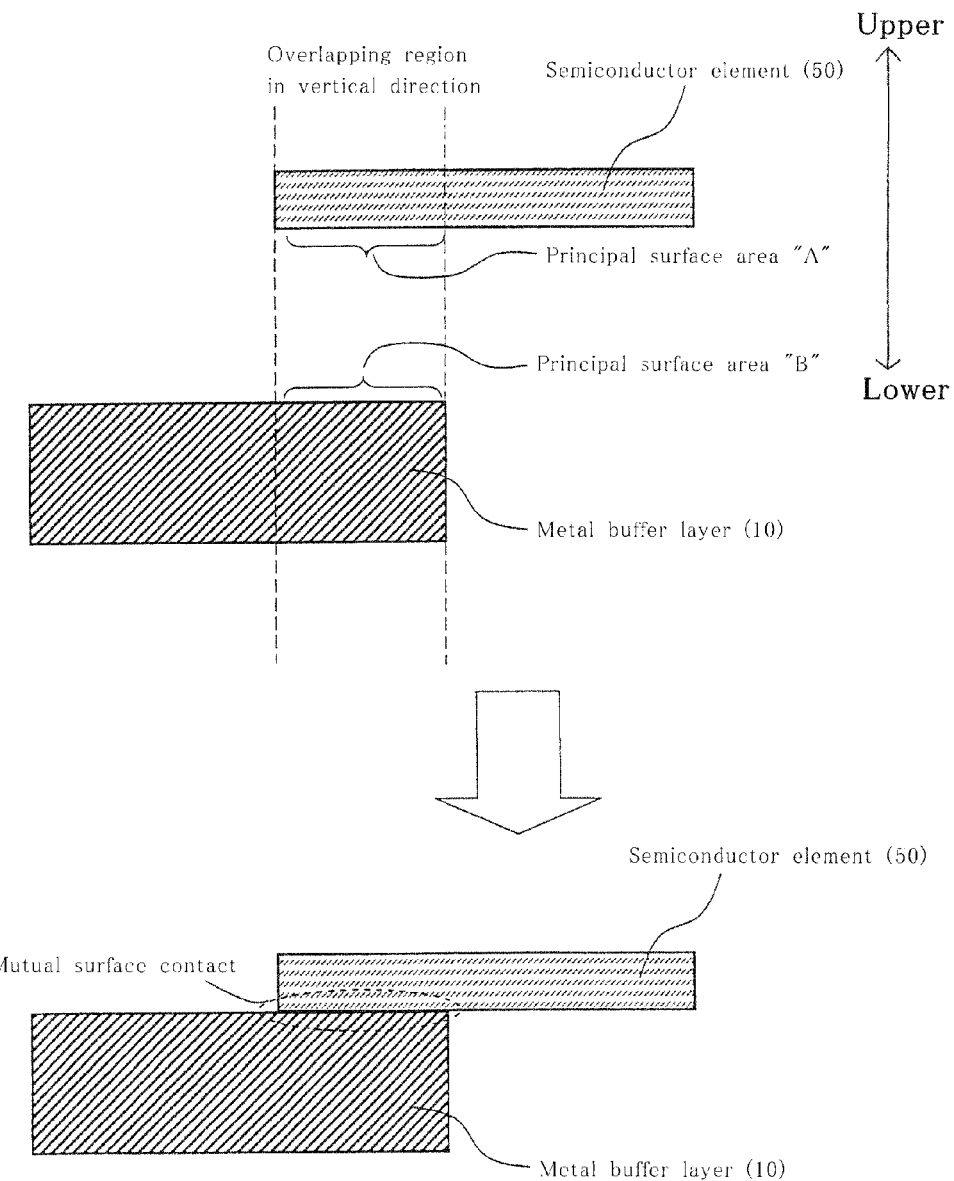
FIG. 4 includes schematic views for explaining "surface contact" according to the present invention.
Figure 14A:
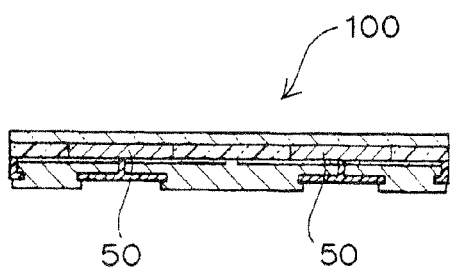
FIGS. 14A to 14B are schematic cross-sectional views for explaining "multi-chip" configuration according to the present invention.
Figure 14B:
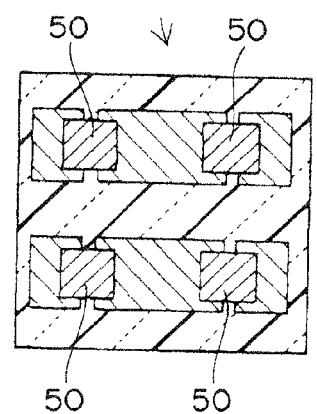

The semiconductor device 100 of the present invention may also be embodied not only as a "single-chip" device where the semiconductor element 50 is provided singly as shown in FIGS. 1-3, but also as a "multi-chip" device where a plurality of the semiconductor elements 50 are provided as shown in FIGS. 14A and 14B, for example. That is, the semiconductor device 100 according to "multi-chip" can be embodied with a plurality of chips arranged in a form of array.

The semiconductor device 100 of the present invention can also be embodied according to the following embodiments.

(Bended Form of Buffer Electrode Part/Electrode Foundation Part)

Figure 15A:
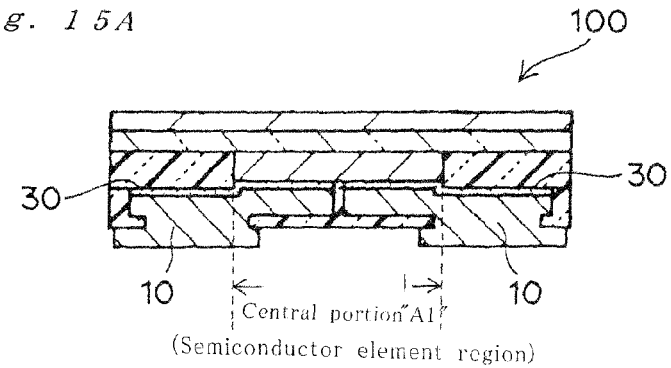
FIGS. 15A to 15D are schematic cross-sectional views for explaining "bended form of metal buffer layer and reflective layer" according to the present invention.
Figure 15B:
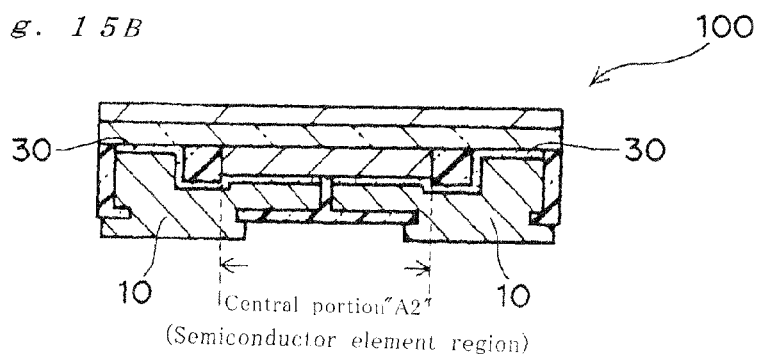

FIGS. 15A-15D show "bended form of metal buffer layer/foundation". As illustrated, the metal buffer layer 10 (in particularly, upper surfaces thereof) and the foundation 30 serving as the reflective layer respectively have a bended form. In FIG. 15A, the metal buffer layer 10 and the foundation 30 positioned thereunder are in such a bended form that a central portion "A1" thereof (i.e., semiconductor element region) is slightly raised. In FIG. 15B, the metal buffer layer 10 and the foundation 30 are in such a bended form that most portions thereof are recessed while a central portion "A2" of the metal buffer layer 10 and the foundation 30 (i.e., semiconductor element region) is slightly raised. From another viewpoint, the embodiment shown in FIG.

Figure 15C:
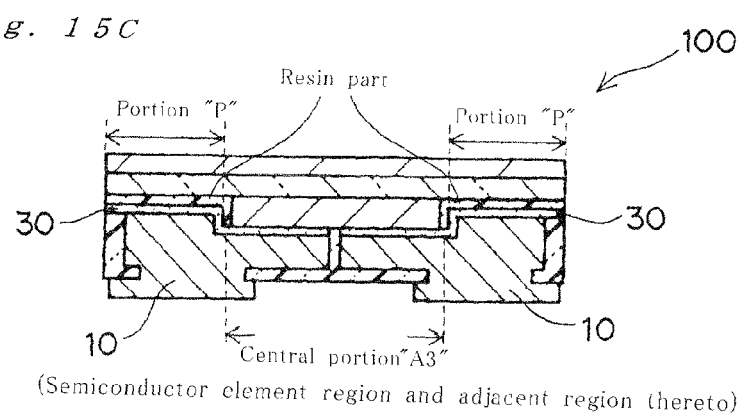

15B can be regarded as an embodiment where the thickness of the metal buffer layer 10 positioned at the outer side of the device is increased. In FIG. 15C, the metal buffer layer 10 and the foundation 30 are in a bended form that a central portion "A3" thereof (i.e., semiconductor element region and also its nearby region) is slightly recessed. The embodiment can also be regarded as an embodiment where the thickness of the metal buffer layer positioned at the outer side of the device is increased. Moreover, an embodiment shown in FIG. 15D corresponds to an embodiment where the portions "P" of the insulating layer have been removed from the embodiment shown in FIG. 15C. Even in the embodiments as shown in FIGS. 15A-15D, the both performances of "heat releasing", "electrical connection" and "stress-relaxation effect" can be suitably achieved.

Embodiment of Reflector Structure

Figure 16:
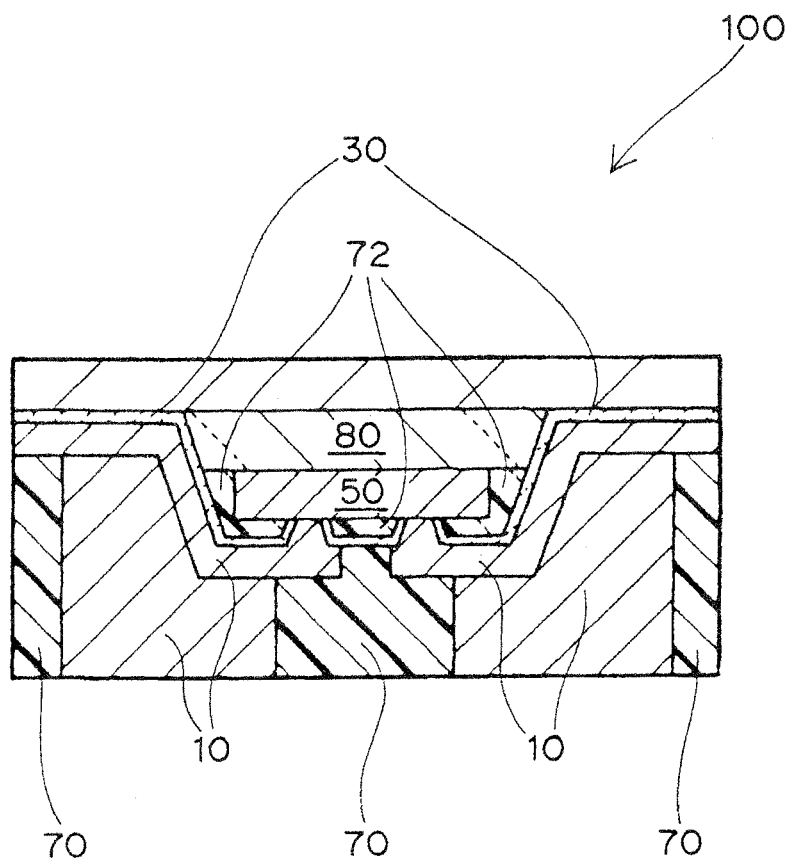
FIG. 16 is a schematic sectional view of the form/configuration of a reflector structure of the semiconductor device according to the present invention.

FIG. 16 illustrates the semiconductor device 100 having a reflector structure according to the present invention. The embodiment of the reflector structure may correspond to a modified embodiment of the bended form of the metal buffer layer/foundation. According to the reflector structure, the metal buffer layer 10 (in particular, a portion of the layer) and the foundation 30 are in a bended form such that they are greatly recessed and the semiconductor element 50 is positioned in the recessed region. Even according to the reflector structure, the both performances of "heat releasing", "electrical connection" and "stress-relaxation effect" can be suitably achieved. In particular, the embodiment of "reflector" enables the foundation 30 around the semiconductor element 50 to serve to effectively reflect the light from the semiconductor element 50. In this regard, the foundation 30 is positioned at a higher level than that of the light-emitting surface of the light-emitting semiconductor element, and thereby the light extraction performance can be particularly improved. Moreover, the light-emitting device with the reflector structure can provide advantageous effects such as "higher density (i.e., smaller device)", "higher thermal conductivity" and "more simplified manufacturing process".

[Method for Manufacturing Semiconductor Device According to the Present Invention]

Figure 17A:
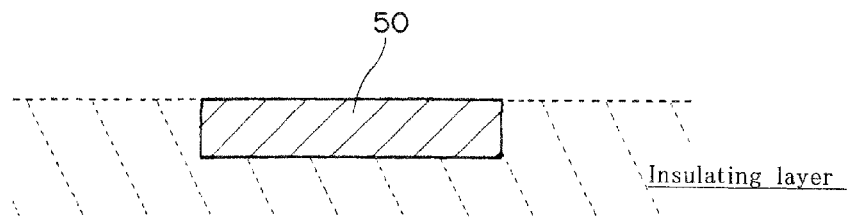
FIGS. 17A to 17D are process-cross sectional views schematically illustrating a manufacturing method according to the present invention.
Figure 17B:
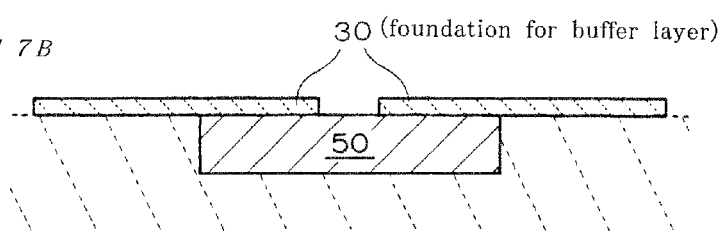
Figure 17C:
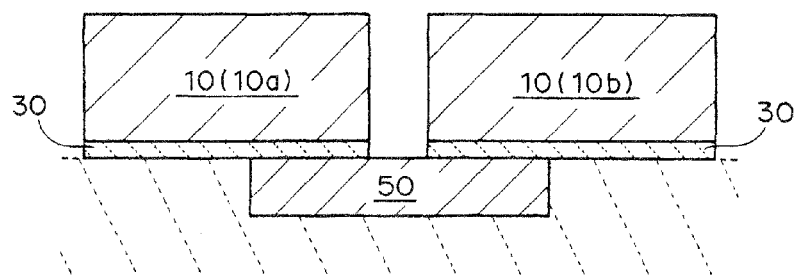

Next, a method for manufacturing the semiconductor device according to the present invention will be described. FIGS. 17A-17D schematically illustrate processes associated with the manufacturing method of the present invention. In the manufacturing method of the present invention, a step (i) is firstly carried out to provide the semiconductor element 50 as shown in FIG. 17A. It is preferred that the semiconductor element 50 is suitably provided for the following formations of the metal buffer layer and the foundation therefor. For example, "semiconductor element having an insulating layer at least on a principal surface of the semiconductor element" is provided as the semiconductor element 50 in the step (i). By way of example, the semiconductor element 50 is provided in a form of being in an embedded state in the insulating layer, as shown in FIG. 17A. Then, a step (ii) is carried out to form the metal buffer layer 10 on the semiconductor element 50. Specifically, the semiconductor element 50 is subjected to a direct metallization process (for example, a Cu direct metallization process). In the step (ii), the foundation 30 for the formation of the metal buffer layer is formed on the semiconductor element 50 as shown in FIG. 17B. In particular, the foundation 30 is formed such that it covers a portion of the principal surface of the semiconductor element. Thereafter, the metal buffer layer 10 is formed to make surface contact with the semiconductor element 50 via the foundation 30 as shown in FIG. 17C. Through the steps (i) and (ii), there can be obtained the semiconductor device 100 of the present invention (see FIG. 17D).

Figure 17D:
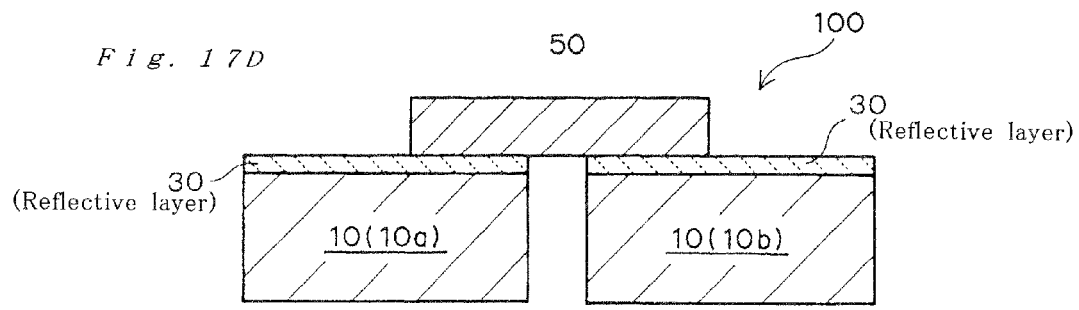
Figure 19:
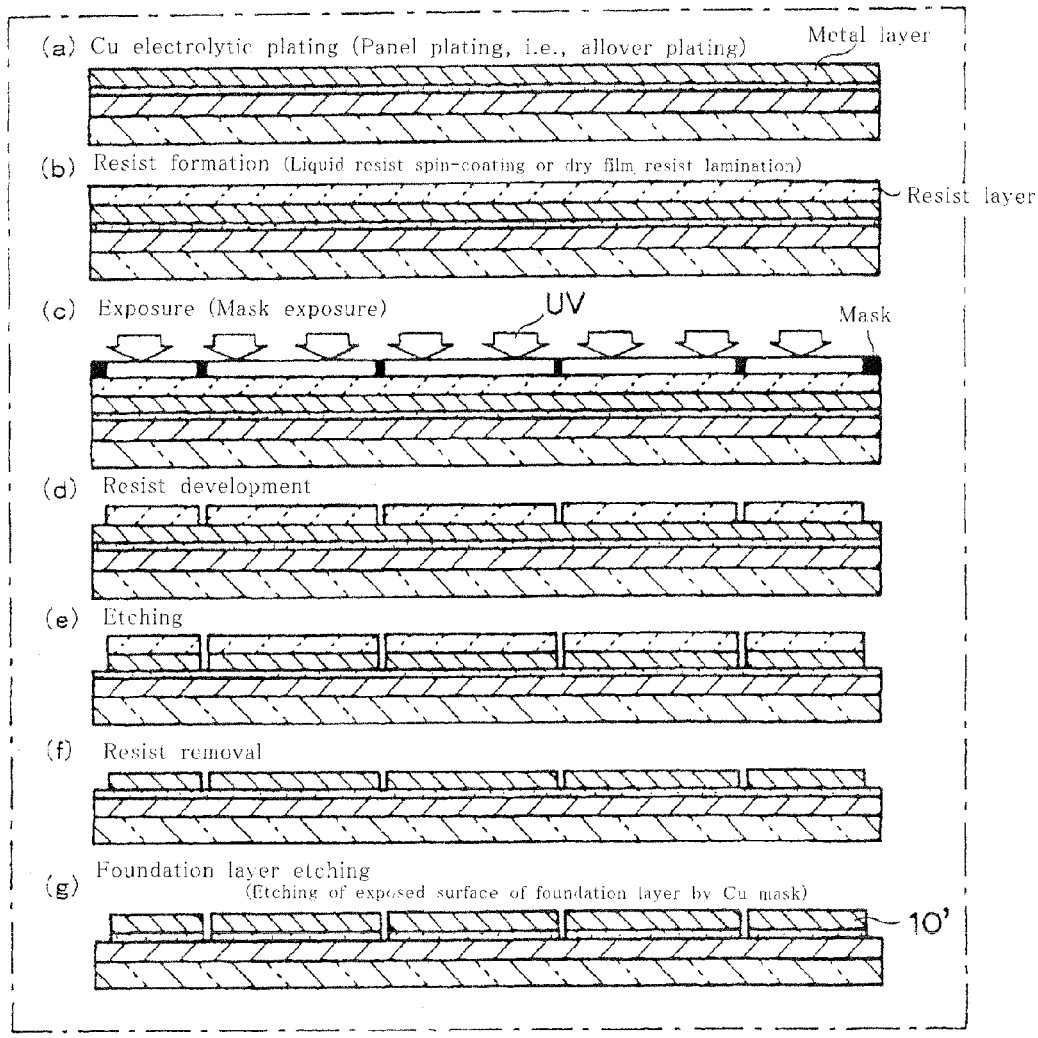
FIGS. 19(a) to 19(g) are process-cross sectional views schematically illustrating such an embodiment that a patterning of a sub-buffer layer is performed by "Patterning process by etching after plating".
Figure 20:
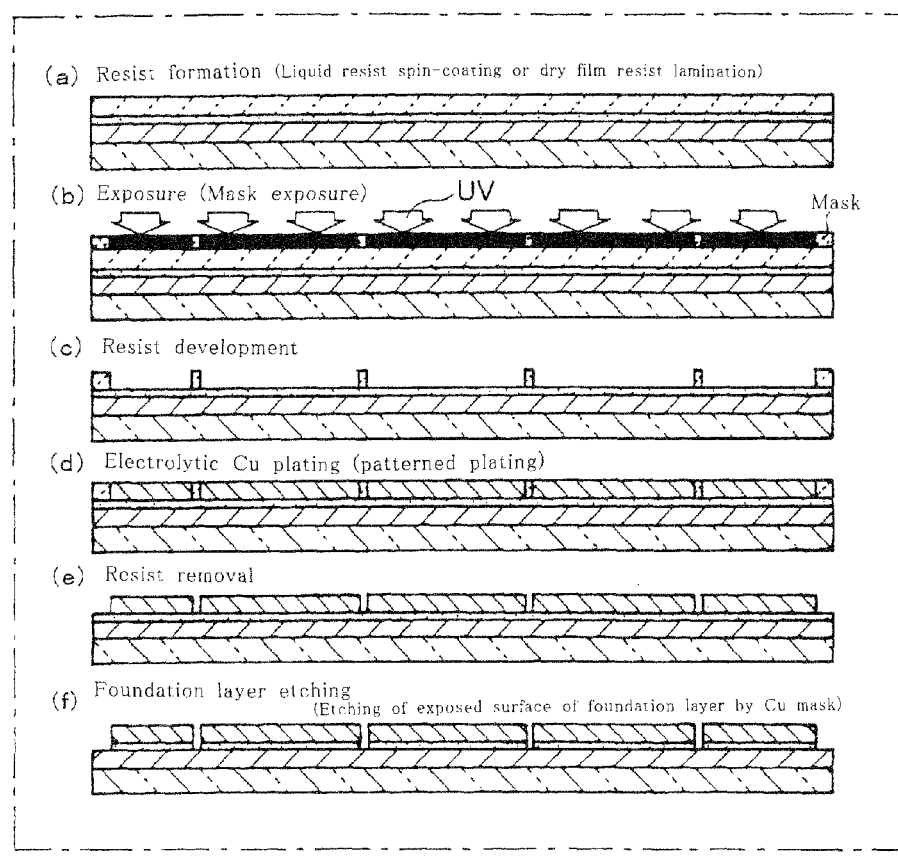
FIGS. 20(a) to 20(f) are process-cross sectional views schematically illustrating such an embodiment that a patterning of a sub-buffer layer is performed by "Patterned plating process after formation of resist pattern".

In a case of the light-emitting semiconductor element, the foundation 30 used for the formation of the metal buffer layer can be eventually used as the reflective layer of the semiconductor device 100 as shown in FIG. 17D.

The processes in the manufacturing method of the present invention are relatively simple in that the metal buffer layer is directly formed on the semiconductor element. By such simple processes, there can be obtained the semiconductor device capable of satisfying the performances of "heat releasing", "electrical connection" and "stress-relaxation effect". In particular, when focusing on the manufacturing processes, the buffer electrode part 10 for the semiconductor element can be formed with being thicker and having good adhesion due to the presence of the foundation 30.

It is preferred that the foundation 30 for the buffer layer is formed by a dry plating process whereas the metal buffer layer 10 is formed by a wet plating process. As such, it is preferred that the foundation 30 is provided as a dry plating layer whereas the metal buffer layer 10 is provided as a wet plating layer. In a case where the foundation for the buffer layer is formed by the dry plating process whereas the metal buffer layer is formed by the wet plating process, and the semiconductor element is a light-emitting element (i.e., a case where the foundation for the buffer layer is used as the reflective layer), the manufacturing method according to the present invention includes the following embodiments:

The foundation layer (i.e., dry plating layer) and the wider metal buffer layer (i.e., wet plating layer) positioned thereon are formed directly with respect to the semiconductor element. The foundation layer, i.e., the dry plating layer is used as the reflective layer positioned underneath the semiconductor element, whereas the metal buffer layer, i.e., the wet plating layer is used as the supporting layer (together with the dry plating layer serving as the reflective layer).

Examples of the dry plating process include a vacuum plating process (Physical Vapor Deposition, i.e., PVD process) and a chemical vapor plating process (Chemical Vapor Deposition, i.e., CVD process). Examples of the vacuum plating process include a vacuum deposition process, a sputtering process, and an ion plating process. On the other hand, examples of the wet plating process include an electroplating process, a chemical plating process, and a hot-dip plating process. In a preferred embodiment, the foundation 30 is formed by the sputtering process, and then the metal buffer layer 10 is formed by the electroplating process (e.g., an electrolytic plating process) in the manufacturing method of the present invention.

The formation of the metal buffer layer 10 by the electrolytic plating process may be performed by changing the composition of the plating liquid over time. The changing of the composition of the plating liquid over time makes it possible to provide the difference in crystal structure between "local region positioned at the side of the semiconductor element" and "local region positioned at the outer side of the buffer layer". As the electrolytic plating process for forming the metal buffer layer 10, a so-called "copper sulfate plating" i.e., a plating process using a plating solution which contains a copper sulfate, a sulfuric acid, a chlorine and an additive agent. The use of the additive (e.g., "additive comprising unsaturated aliphatics") in the plating solution, or the changing of the concentration of the plating solution makes it possible to provide the difference in crystal structure between "local region positioned at the side of the semiconductor element" and "local region positioned at the outer side of the buffer layer". Alternatively, the changing of the current value during the plating process also makes it possible to provide the difference in crystal structure between "local region positioned at the side of the semiconductor element" and "local region positioned at the outer side of the buffer layer". Alternatively, the pulse control with the polarity reversal of the current being performed during the electroplating process also makes it possible to provide the difference in crystal structure between "local region positioned at the side of the semiconductor element" and "local region positioned at the outer side of the buffer layer". When the pulse portion on the negative side is smaller than the pulse portion on the positive side, the crystal grain size (the average crystal grain size) in the metal buffer layer becomes smaller. While on the other hand, when the pulse portion on the negative side is larger than the pulse portion on the positive side, the crystal grain size (the average crystal grain size) in the metal buffer layer becomes larger. Taking an embodiment as an example wherein an application of "$+I_1$" ampere in $T_1$ msec and an application of "$-I_2$" ampere in $T_2$ msec are repeated, a smaller ratio of "$I_2 \times T_2$" to "$I_1 \times T_1$" (i.e., "$I_2 \times T_2$"/"$I_1 \times T_1$") enables the crystal grain size (the average crystal grain size) in the metal buffer layer to become smaller, and whereas a larger ratio of "$I_2 \times T_2$" to "$I_1 \times T_1$" (i.e., "$I_2 \times T_2$"/"$I_1 \times T_1$") enables the crystal grain size (the average crystal grain size) in the metal buffer layer to become larger. Therefore, the smaller pulse portion on the negative side with respect to the that of the positive side during the early part of the plating process enables the average crystal grain size to become smaller in the local region positioned at the side of the semiconductor element, whereas the larger pulse portion on the negative side with respect to the that of the positive side during the latter part of the plating process enables the average crystal grain size to become larger in the local region positioned at the outer side of the buffer layer.

When the metal buffer layer 10 with the particles contained therein is formed, the plating liquid with such particles dispersed therein may be used. In other words, a precipitation process is performed by using the metal particles-dispersed plating liquid, and thereby the metal buffer layer 10 with the particles contained therein can be formed. The dispersed metal particles may be made of material which is different from the base material (i.e., plating material) of the metal buffer layer. Examples of such metal particles may include silver particles, palladium particles, platinum particles, nickel particles and copper particles. Alternatively, the dispersed metal particles may be insulating particles. Examples of the insulating particles may include ceramic oxide particles, silicide particles and nitride particles. The more particles in the plating liquid enables the particle content in the metal buffer layer to become higher, whereas the less particles in the plating liquid enables the particle content in the metal buffer layer to become lower. In other words, the containing of relatively large amount of particles in the plating liquid for the formation of the local buffer region positioned at the side of the semiconductor element will lead to a higher particle content in such local region of the metal buffer layer. The containing of relatively small amount of particles in the plating liquid for the formation of the local buffer region positioned at the side of the secondary mount substrate will lead to a lower particle content in such local region of the metal buffer layer. In a preferred embodiment, the particle content in the local region of the buffer layer gradually becomes smaller as the incorporation of the particles into the plating material (i.e., metal buffer layer) proceeds over time during the plating process.

The foundation 30 is not limited to a single layer but may be formed as a form of multiple layers. For example, a Ti thin film layer and a Cu thin film layer may be formed as the foundation 30 by the sputtering process. More specifically, the formation of the Ti thin film layer is performed, followed by the formation of the Cu thin film layer, the both formations being performed by the sputtering process. On such sputtering layers having the two-layers structure, it is preferable to form the metal buffer layer 10 by a Cu electrolytic plating process.

The manufacturing method of the present invention can be performed in various process embodiments, which will be now described below.

(Process Embodiment 1)

FIGS. 18A-18G illustrate schematic sectional views of the processes according to "Process Embodiment 1". This embodiment corresponds to the processes for carrying out the manufacturing of the semiconductor device, based on a semiconductor wafer. Firstly, as shown in FIGS. 18A and 18B, a sealing layer 72' is formed on a principal surface of a semiconductor wafer 50'. The sealing layer 72' may be formed by applying a raw material onto the principal surface of the semiconductor wafer by a doctor blade process or a spin coating process, followed by a heat treatment thereof. Alternatively, the sealing layer 72' may also be formed by superimposing a sealing film onto the semiconductor wafer. Then, as shown in FIG. 18C, a foundation 30 for buffer layer is formed, for example, by a dry plating process (e.g., sputtering process). Then, as shown in FIG. 18D, a sub-buffer layer pattern 10' is formed directly on the semiconductor wafer 50 via the foundation 30. The formation of the sub-buffer layer pattern 10' may be performed by "Patterning by etching after plating" as shown in FIGS. 19(a)-19(g). Specifically, as illustrated, a metal layer (e.g., Cu layer) is formed on the entire surface of the foundation by an electroplating process (e.g., Cu electroplating process).

As described above, the formation of the metal layer may be performed by changing the composition of the plating liquid over time. In this regard, the successive change of the composition of the electrolytic copper plating liquid may be performed over time. Alternatively, the formation of the metal layer may be performed by using the plating liquid with the particles dispersed therein. In this regard, the plating liquid with the tungsten particles dispersed therein may be used, in which case a jet flow of the plating liquid may be provided with respect to a plating area. This enables the tungsten particles to be incorporated in the metal layer. Instead of such metal particles, the plating liquid with the ceramic particles (e.g., alumina particles) dispersed therein may also be used to incorporate the ceramic particles into the metal layer.

Subsequent to the formation of the metal layer on the foundation, a resist layer is formed by a liquid resist spin-coating process or a dry film resist lamination process, etc. Then, mask exposure (i.e., exposure via mask) and development treatments are performed. Thereafter, a resist development treatment, and an etching treatment of the metal layer are performed, followed by the removal of the resist layer. Finally, the foundation is subjected to an etching treatment by using the metal pattern as a mask. Alternatively, as shown in FIGS. 20(a)-20(f), the sub-buffer layer pattern 10' may be formed by "Patterned plating after formation of resist pattern". Specifically, as illustrated, a resist layer is formed by a liquid resist spin-coating process or a dry film resist lamination process. Thereafter, mask exposure and resist development treatments are performed. Then, patterned plating process (e.g., electrolytic Cu pattern plating process) is performed. Thereafter, the resist layer is removed, and finally the foundation is subjected to an etching treatment by using the metal pattern as a mask.

Subsequent to the formation of the sub-buffer layer pattern 10', an insulating layer pattern is formed as shown in FIG. 18E. As illustrated, the insulating layer pattern 70' is preferably formed such that the insulating layer pattern 70' bridges two neighboring sub-buffer layers 10', filling the space between the two neighboring sub-buffer layers 10'. In a case where the raw material for the insulating layer is a photosensitive material, the material may be applied allover by a spin coating process or a doctor blade process, or the material may be provided by superimposing the insulating layer film, and thereafter the mask exposure and development treatment may be performed to form the insulating layer pattern 70' (see FIGS. 21A(a)-21A(c)). In this regard, the photosensitivity of the material may be either a positive type or a negative type. While on the other hand, in a case where the raw material for the insulating layer is not the photosensitive material, the insulating layer pattern 70' may be formed by printing the pattern directly by a printing process (see FIG. 21B).

Subsequent to the formation of the insulating layer pattern 70', the sub-buffer layer pattern 10" is formed such that the sub-buffer layer pattern 10" is integrally jointed to the sub-buffer layer pattern 10' (see FIG. 18F). The formation of the sub-buffer layer pattern 10" can be performed by the electroplating process which is similar to that of the formation of the sub-buffer layer pattern 10'. Alternatively, the formation of the sub-buffer layer pattern 10" can be performed by "Patterning by etching after plating" or "Patterned plating after formation of resist pattern" as described above.

As such, the formation of the metal buffer layer 10 includes two phases to form the first sub-buffer layer 10' and to form the second sub-buffer layer 10", in which case the formation of the insulating layer 70' is conducted at a point in time between the formation of the first sub-buffer layer 10' and the formation of the second sub-buffer layer 10" (FIGS. 18D-18F). These processes make it possible to form "local region of insulating part" located between the electrode portions of the semiconductor element, such local region being preferably composed of two portions of "narrower region" and "wider region" (see FIG. 18F). As for the two-phased formation of the metal buffer layer 10, the thickness of the first sub-buffer layer 10' to be formed initially may be greater than the thickness of the second sub-buffer layer 10" to be formed thereafter.

Finally, as shown in FIG. 18G, a cutting operation is conducted to divide the sealing layer 72' and the semiconductor wafer 50' per unit which includes two buffer layers 10 each including the first sub-buffer layer 10' and the second sub-buffer layer 10'. There can be finally obtained the semiconductor device 100 as shown at the bottom of FIG. 18. In a case of the light-emitting semiconductor element, the foundation 30 is utilized as the reflective layer in the semiconductor device 100.

Furthermore, in the case of the manufacturing of the device using the semiconductor wafer as described above, the individual buffer layer can laterally protrude beyond the semiconductor element due to the fact that the cutting operation as shown in FIG. 18G is performed. According to the above-mentioned processes, various elements can be formed on the semiconductor wafer so that the clean surface (i.e., flat surface) of the wafer is used as a starting site of the formation, which can promote an achievement of the preferable processes.

(Process Embodiment 2)

FIGS. 22A-22H illustrate schematic sectional views of the processes according to "Process Embodiment 2". This embodiment corresponds to the processes for carrying out the manufacturing of the semiconductor device, based on semiconductor chips. Firstly, as shown in FIG. 22A, a plurality of semiconductor chips 50 are disposed on a carrier film 85 with being spaced away from each other. Then, as shown in FIG. 22B, a sealing layer 72' (in particular, a light-permeability sealing layer in a case of the light-emitting semiconductor element) is formed on the carrier film 85, and thereby the semiconductor chips 50 are covered with the sealing layer. Subsequent to the formation of the sealing layer 72', the career film 85 is removed, and thereby obtaining the semiconductor chips 50 buried in the sealing layer 72' as shown in FIG. 22C. That is, there can be provided the semiconductor elements with the sealing layer being located at least on the principal surfaces of the semiconductor elements. In particular, the semiconductor elements 50 buried in the sealing layer 72' is provided, the semiconductor elements 50 being flush with the sealing layer 72'.

Thereafter, as shown in FIG. 22D, the foundation 30 for metal buffer layer is formed by a dry plating process (e.g., sputtering process). Because of the "flush with", the foundation 30 as sputtering layer can be suitably formed uniformly at a constant thickness. Then, as shown in FIG. 22E, a sub-buffer layer pattern 10' is formed directly on the semiconductor chips 50 via the foundation 30.

The formation of the sub-buffer layer pattern 10' can be performed by "Patterning by etching after plating" or "Patterned plating after formation of resist pattern" as described above with respect to "Process Embodiment 1". Subsequent to the formation of the sub-buffer layer pattern 10', an insulating layer pattern 70' is formed as shown in FIG. 22F. As illustrated, the insulating layer 70' is preferably formed such that it bridges two neighboring sub-buffer layers 10', filling the space between the two neighboring buffer layers 10'. The formation of the insulating layer pattern 70' can be performed in the same manner as described above with respect to "Process Embodiment 1" (see FIGS. 21A(a)-21A (c) or FIG. 21B). Subsequent to the formation of the insulating layer pattern 70', as shown in FIG. 22G, a second sub-buffer layer pattern 10" is formed to integrally join the sub-buffer layer pattern 10'. The formation of the second sub-buffer layer pattern 10" can be performed by the electroplating process which is similar to that of the formation of the first sub-buffer layer pattern 10'. Alternatively, the formation of the second sub-buffer layer pattern 10" can be performed by "Patterning by etching after plating" or "Patterned plating after formation of resist pattern" as described above.

As for the formations of the sub-buffer layer patterns 10' and 10", the locally changing of the crystal structure thereof, or the containing of the particles therein may be performed. In this regard, the sub-buffer layer patterns 10' and 10" may be subjected to the changing of the crystal structure and the particle content. Alternatively, the two sub-buffer layer patterns 10' and 10" are regarded as a single layer pattern as a whole, and thereby such single layer pattern may be subjected to the changing of the crystal structure and the particle content.

Even in the case of "Process Embodiment 2", the formation of the metal buffer layer includes two phases to form the first sub-buffer layer 10' and to form the second sub-buffer layer 10", in which case the formation of the insulating layer is conducted at a point in time between "formation of the first sub-buffer layers 10'''" and "formation of the second sub-buffer layers 10''''" (see FIGS. 22E-22G). These processes make it possible to form "local region of insulating part" located between the buffer layers, such local region being preferably composed of two portions of "narrower region" and "wider region" (see FIG. 22G). As illustrated, according to "Process Embodiment 2", each of the metal buffer layers 10 composed of the first sub-buffer layer 10' and the second sub-buffer layer 10" is formed preferably such that the metal buffer layer extends toward the outside of the semiconductor chip 50, and thereby the metal buffer layer protrudes beyond the semiconductor chip 50.

As shown in FIG. 22H, a cutting operation is finally conducted per unit of the chip to divide the semiconductor chips 50 into the separate chips. As a result, there can be obtained the semiconductor device 100 as shown at the bottom of FIG. 22. In a case of the light-emitting element, the foundation 30 can be used as the reflective layer in the semiconductor device.

(Process Embodiment 3)

FIGS. 23A-23G illustrate schematic sectional views of the processes according to "Process Embodiment 3". This embodiment corresponds to a modification of "Process Embodiment 2". Firstly, as shown in FIG. 23A, a plurality of semiconductor chips 50 are disposed on a carrier film 85 with being spaced away from each other. Then, an insulating film 72' (e.g., insulating film made of inorganic material) is formed between the neighboring semiconductor chips 50. As illustrated, the insulating film 72' is preferably formed such that it is flush with the semiconductor chips 50. The patterning of the insulating layer 72' can be performed in the above-described manner with respect to "Process Embodiment 1" (see FIG. 21A(a)-21A(c) or 21B). Subsequent to the patterning of the insulating layer 72', a phosphor layer 80 is formed on the semiconductor chips 50 and the insulating layer pattern 72' in a case of the light-emitting semiconductor element (see FIG. 23B), and thereafter the carrier film 85 is removed. As a result, there can be provided the semiconductor elements 50 as shown in FIG. 23C.

Then, similarly to "Process Embodiment 2", a foundation 30 for metal buffer layer, a sub-buffer layer pattern 10', an insulating layer 70', and a second sub-buffer layer pattern 10" are sequentially formed, followed by the cutting operation thereof (see FIGS. 23D through 23G). As a result, there can be obtained the semiconductor device 100 as shown at the bottom of FIG. 23. Instead of "formation of the insulating film 72' between the neighboring semiconductor chips 50", an insulating layer including phosphor component can be formed on the carrier film 85 to cover the semiconductor chips 50 in a case of the light-emitting semiconductor element. In this case, there can be obtained the semiconductor device 100 as shown at the right bottom in FIG. 23. That is, there can be obtained the "semiconductor device where the second insulating part comprises a phosphor component" described in the above [Light emitting devices of the present invention].

(Process Embodiment 4)

FIGS. 24A-24G illustrate schematic sectional views of the processes according to "Process Embodiment 4" in a case of the light-emitting semiconductor element. This embodiment also corresponds to a modification of "Process Embodiment 2". Firstly, a phosphor layer 80 is formed on a carrier film 85, and thereafter a plurality of semiconductor chips 50 are disposed on the phosphor layer 80 with being spaced away from each other (see FIG. 24A). Then, as shown in FIG. 24B, an insulating layer 72' (in particular, photosensitive material layers) is formed on the phosphor layer 80 to cover the semiconductor chips 50. Subsequently, as shown in FIG. 24C, the insulating layer 72' is subjected to a patterning treatment. As illustrated, the patterning treatment is preferably performed so that a part of the insulating layers 72' is left, the part being positioned between the neighboring semiconductor chips 50. Such patterning treatment may be performed in the same manner as described above with respect to "Process Embodiment 1" (see FIGS. 21A(a)-21A(c)).

Figure 15D:
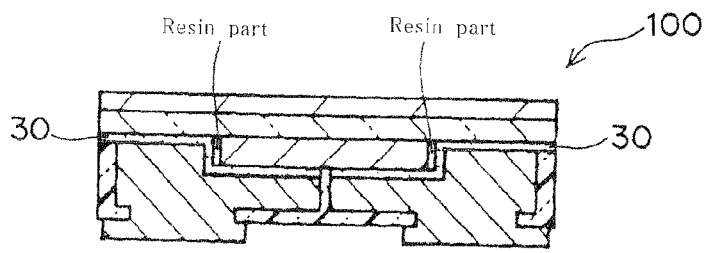
Figure 25:
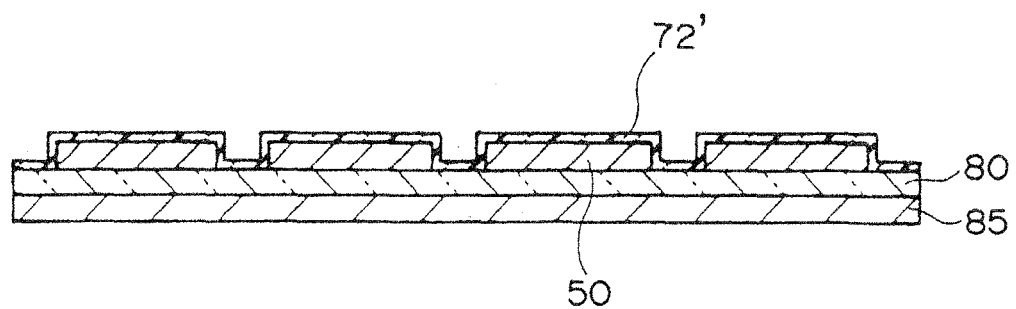
FIG. 25 is a schematic cross-sectional view for explaining a modified embodiment of an insulating layer and a patterning process thereof.

Then, similarly to "Process Embodiment 2", a foundation 30 for metal buffer layer, a sub-buffer layer pattern 10', an insulating layer 70', and a second sub-buffer layer pattern 10" are sequentially formed, followed by the cutting operation thereof (see FIGS. 24D through 24G). As a result, there can be obtained the semiconductor device 100 as shown at the bottom of FIG. 24. In this process embodiment, the phosphor layer is formed by an application process or a superimposing process with respect to the surface of the career film. Thus, the phosphor layer can be provided preferably in a form of "plane", which is different from that of the conventional semiconductor package where the phosphor layer is generally provided after the singulation process. In this "Process Embodiment 4", the carrier film 85 is eventually maintained as being not removed but used as a component/part of the semiconductor device. In this regard, for example as shown in FIGS. 13A and 13B, the carrier film 85 can be used as a lens part. Furthermore, in this "Process Embodiment 4", the formation of the insulating layer 72' or the patterning treatment thereof may be suitably adjusted (for example, see FIG. 25) to provide the semiconductor devices as shown in FIGS. 15C and 15D described in the above [Light emitting devices of the present invention]. In the case of the light-emitting semiconductor element, the foundation 30 for metal buffer layer can be used as the reflective layer.

(Process Embodiment 5)

FIGS. 26A-26G illustrate schematic sectional views of the processes according to "Process Embodiment 5" in a case of the light-emitting semiconductor element. This embodiment corresponds to a manufacturing process embodiment of the semiconductor device 100 having the reflector structure. Firstly, a plurality of sub-phosphor layers 80' are formed on a career film 85, and one semiconductor element chip 50 is disposed on each of the sub-phosphor layers 80' (see FIG. 26A). Then, as shown in FIG. 26B, the raw material for insulating layer is applied allover by the spin coating process or the doctor blade process to form the insulating layer. Alternatively, the insulating layer film may be superimposed on the carrier film. Subsequent to the formation of the insulating layer, a patterning treatment thereof is performed to form local insulating layers 72' which partially expose a part of the surface of each of the semiconductor element chips 50 (see FIG. 26C). Subsequently, a foundation 30 for metal buffer layer is formed, and thereafter two first sub-buffer layers 10' are formed on each of the semiconductor element chips (see FIG. 26D). As for the "reflector", the foundation 30 and the first sub-buffer layers 10' have bended forms along the outline of a precursors 100' of the semiconductor device, the precursors 100' being composed of the sub-phosphor layers 80', the semiconductor element chips 50 and the local insulating layers 72' all of which are provided on the carrier film 85 (see FIG. 26D).

Subsequently, an insulating part 70' is formed such that it bridges at least two first sub-buffer layers 10', as shown in FIG. 26E. Similar to the formation of the insulating layers 72', a patterning treatment performed after the allover application of the insulating material or the superimposing of the insulating film can result in a pattern of the insulating parts 70'. Thereafter, as shown in FIG. 26F, second sub-buffer layers 10" are formed to be in contact with the first sub-buffer layers 10'. Finally, a cutting operation is performed per unit of chip to divide the semiconductor element chips 50 into the separate chips as shown in FIG. 26G. As a result, there can be obtained the semiconductor device 100 having the reflector structure as shown at the bottom of FIG. 26.

It should be noted that the present invention as described above includes the following aspects:

The first aspect: A semiconductor device comprising:
  a semiconductor element; and
  a metal buffer layer, the metal buffer layer being in an electrical connection to the semiconductor element,
    wherein the metal buffer layer and the semiconductor element are in a connection with each other by mutual surface contact of the metal buffer layer and the semiconductor element, and
    wherein not only the metal buffer layer is an external connection terminal used for a mounting with respect to a secondary mount substrate, but also the metal buffer layer serves as a buffer having a stress-relaxation effect between the semiconductor element and the secondary mount substrate.

The second aspect: The semiconductor device according to the first aspect, wherein the metal buffer layer additionally serves as a supporting layer for supporting the semiconductor element.

The third aspect: The semiconductor device according to the first or second aspect, wherein the metal buffer layer extends such that it protrudes beyond the semiconductor element. In other words, "metal buffer layer" and "reflective layer (or foundation layer)" are not only located in a lower region of the semiconductor element but also extends to an outer region of the lower region in a lateral direction/width direction of the semiconductor element.

The fourth aspect: The semiconductor device according to any one of the first to third aspects, wherein the metal buffer layer has a thickness of 50 µm or larger.

The fifth aspect: The semiconductor device according to any one of the first to fourth aspects, wherein the metal buffer layer has a locally different structure of its crystal grain in which an average crystal grain size in a semiconductor element-sided region of the metal buffer layer is smaller than that of a secondary mount substrate-sided region of the metal buffer layer.

The sixth aspect: The semiconductor device according to the fifth aspect, wherein the average crystal grain size in the semiconductor element-sided region of the metal buffer layer is 5 µm or lower, whereas the average crystal grain size in the secondary mount substrate-sided region of the metal buffer layer is 10 µm or larger.

The seventh aspect: The semiconductor device according to any one of the first to sixth aspects, wherein the metal buffer layer comprises at least one kind of particle in its base material.

The eighth aspect: The semiconductor device according to the seventh aspect, wherein the particle contained in the base material of the metal buffer layer is a metal particle.

The ninth aspect: The semiconductor device according to the seventh aspect, wherein the particle contained in the base material of the metal buffer layer is an insulating particle.

The tenth aspect: The semiconductor device according to any one of the seventh to ninth aspects, wherein a content of the particle differs locally in the metal buffer layer in which the particle content in a semiconductor element-sided region of the metal buffer layer is higher than that of a secondary mount substrate-sided region of the metal buffer layer.

The eleventh aspect: The semiconductor device according to any one of the seventh aspect and the eighth to tenth aspects when appendant to the seventh aspect, wherein the base material of the metal buffer layer is provided as a material of plating layer in which the particle is contained.

The twelfth aspect: The semiconductor device according to any one of the first to eleventh aspects, further comprising a first insulating part provided around the metal buffer layer and a second insulating part provided around the semiconductor element.

The thirteenth aspect: The semiconductor device according to the twelfth aspect when appendant to the second aspect, wherein the metal buffer layer and the first insulating part serve as the supporting layer.

The fourteenth aspect: The semiconductor device according to the twelfth or thirteenth aspect, wherein the semiconductor element has a plurality of electrodes, and a plurality of the metal buffer layers are provided such that they are electrically connected to the electrodes, and
  wherein the first insulating part is provided at least between the adjacent metal buffer layers.

The fifteenth aspect: The semiconductor device according to the fourteenth aspect, wherein a local region of the first insulating part is composed of two portions of a narrower region and a wider region, the local region being located between the adjacent metal buffer layers (neighboring metal buffer layers).

The sixteenth aspect: The semiconductor device according to any one of the first to fifteenth aspects, further comprising a reflective layer on the metal buffer layer, wherein the semiconductor element and the metal buffer layer are in connection with each other by mutual surface contact via at least a part of the reflective layer.

The seventeenth aspect: A method for manufacturing a semiconductor device, the method comprising:
  (i) providing a semiconductor element; and
  (ii) forming a metal buffer layer so that the metal buffer layer is in an electrical connection to the semiconductor element,
    wherein, in the step (ii), the formation of the metal buffer layer is performed through mutual surface contact of the metal buffer layer and the semiconductor element, and
    wherein not only the metal buffer layer is an external connection terminal used for a mounting with respect to a secondary mount substrate, but also the metal buffer layer serves as a buffer having a stress-relaxation effect between the semiconductor element and the secondary mount substrate.

The eighteenth aspect: The method according to the seventeenth aspect, wherein, in the step (ii), a foundation layer for the formation of the metal buffer layer is formed on the semiconductor element, and thereafter the metal buffer layer is formed such that the metal buffer layer makes surface contact with the semiconductor element via the foundation layer.

The nineteenth aspect: The method according to the eighteenth aspect, wherein the foundation layer is formed by a dry plating process and the metal buffer layer is formed by a wet plating process.

The twentieth aspect: The method according to any one of the seventeenth to nineteenth aspects, wherein the semiconductor element provided in the step (i) has an insulating layer at least on a principal surface of the semiconductor element.

The twenty-first aspect: The method according to the twentieth aspect, wherein the semiconductor element has a form of a semiconductor element chip, and wherein, in the step (i), the semiconductor element chip is disposed on a carrier film, and the insulating layer is formed on the carrier film to cover the semiconductor element chip and thereafter the carrier film is removed, and thereby the semiconductor element chip buried in the insulating layer is provided, the buried chip being flush with the insulating layer.

The twenty-second aspect: The method according to any one of the seventeenth to twentieth aspects, wherein, in the step (i), the semiconductor element has a form of a semiconductor element chip, and wherein, in the step (ii), the metal buffer layer is formed such that the metal buffer layer extends toward the outside of the semiconductor element chip and thereby a part of the metal buffer layer is beyond the semiconductor element chip.

The twenty-third aspect: The method according to any one of the seventeenth to twentieth aspects, wherein the semiconductor element provided in the step (i) has a form of a semiconductor element wafer, and wherein, in the step (ii), a plurality of the metal buffer layers are formed on the semiconductor element wafer, and wherein a cutting operation is performed in the final stage of the manufacturing of the device to divide at least one of the plurality of the metal buffer layers into two pieces.

The twenty-fourth aspect: The method according to any one of the seventeenth to twenty-third aspects, further comprising forming an insulating part around the metal buffer layer, wherein the formation of the metal buffer layer includes two phases to form a first sub-buffer layer and to form a second sub-buffer layer, and the formation of the insulating part is performed at a point in time between the formation of the first sub-buffer layer and the formation of the second sub-buffer layer.

The twenty-fifth aspect: The method according to the twenty-fourth aspect, wherein a plurality of the metal buffer layers are formed in the step (ii), and wherein the insulating part is formed such that the insulating part bridges two neighboring metal buffer layers (two adjacent metal buffer layers), filling a space between the two neighboring metal buffer layers.

The twenty-sixth aspect: The method according to any one of the eighteenth aspect and the nineteenth to twenty-fifth aspects when appendant to the eighteenth aspect, wherein the foundation layer is eventually used as a reflective layer of the semiconductor device.

While some embodiments of the present invention have been hereinbefore described, they are merely the typical embodiments. It will be readily appreciated by those skilled in the art that the present invention is not limited to the above embodiments, and that various modifications are possible without departing from the scope of the present invention.

Figure 28:
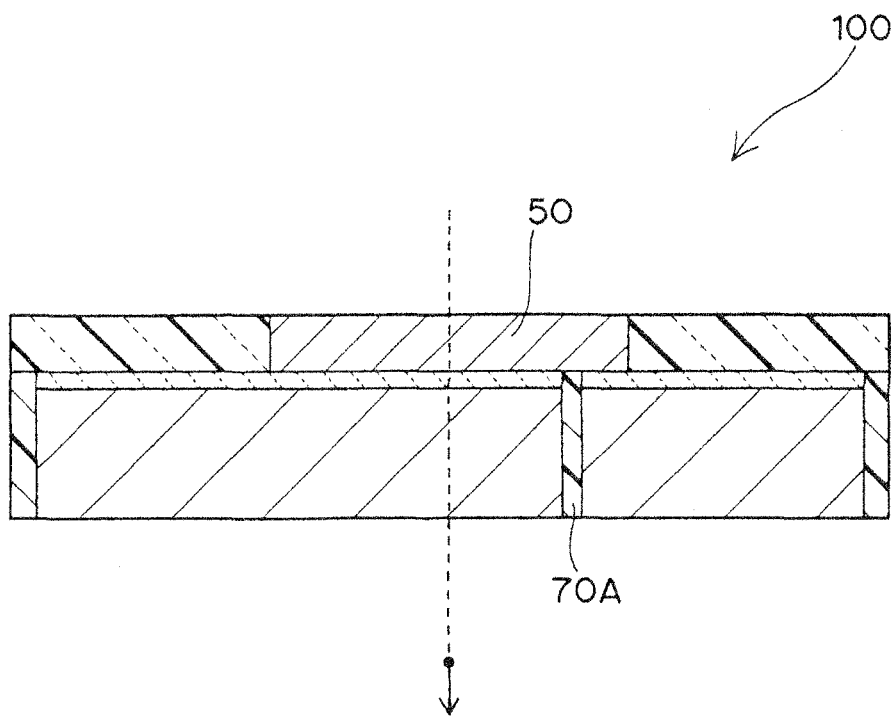
FIG. 28 is a schematic view for explaining a modified position of the local region 70A of the first insulating part.
Figure 29A:
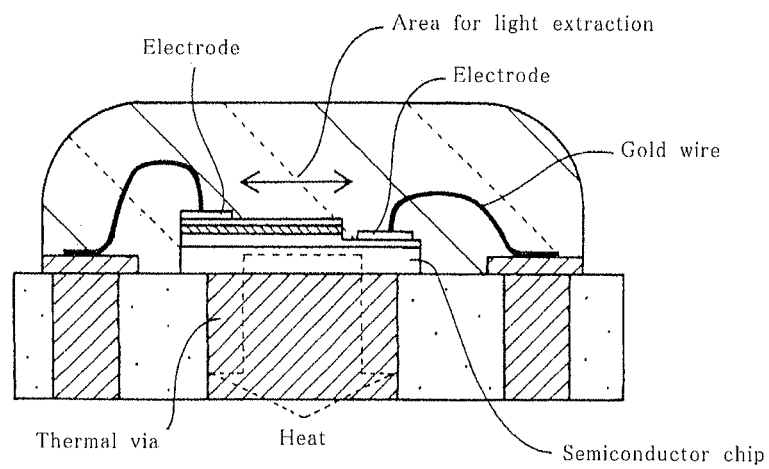
FIGS. 29A to 29B are schematic sectional views illustrating the configurations of a semiconductor chip package according to the prior art.
Figure 29B:
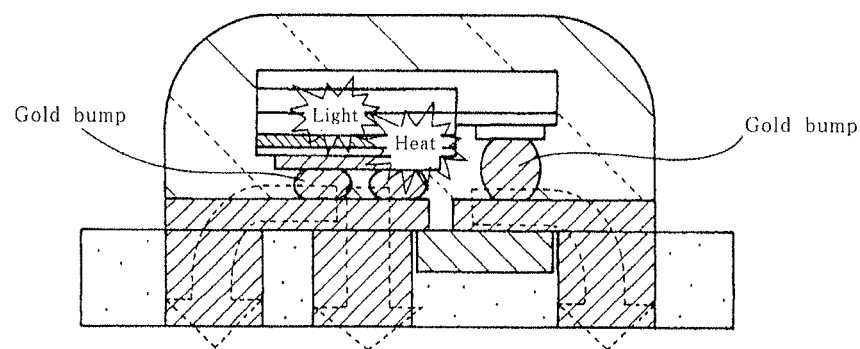

For example, in the above embodiments, the "local region 70A of the first insulating part" provided between the adjacent metal buffer layers is positioned below the central portion of the semiconductor element (see FIG. 11, for example). However, the present invention is not limited to such embodiments. In view of the matters that the size of each of the metal buffer layers varies depending on the size of the electrode of the semiconductor element (to which the metal buffer layer is connected) as shown in FIG. 27, the local region 70A of the first insulating part may be positioned offset from below the central portion of the semiconductor element as shown in the cross-sectional view (A-A' cross-sectional view) of FIG. 27 and the schematic cross-sectional view of FIG. 28.

INDUSTRIAL APPLICABILITY

The semiconductor device according to the present invention can be suitably used as a heat-releasing semiconductor device. For example, the semiconductor device can be suitably used for a hybrid automobile equipped with a gasoline engine combined with an electric motor, and also for a large-current controlling module of the motor in an electric automobile. Furthermore, the semiconductor device according to the present invention can be suitably used for various types of lighting applications as well as a wide range of applications such as backlight source applications for display device (especially "liquid crystal display"), camera flash applications, and automotive applications.

CROSS REFERENCE TO RELATED PATENT APPLICATION

The present application claims the right of priority of Japan patent application No. 2012-195161 (filing date: Sep. 5, 2012, title of the invention: SEMICONDUCTOR DEVICE AND METHOD FOR MANUFACTURING THE SAME), the whole contents of which are incorporated herein by reference.

EXPLANATION OF REFERENCE NUMERALS

10 Metal buffer layer
10' Sub-buffer layer pattern (first sub-buffer layer pattern)
10" Second sub-buffer layer pattern (second sub-buffer layer pattern)
10a Metal buffer layer
10b Metal buffer layer
15 Particle contained in metal buffer layer
30 Foundation for metal buffer layer
50 Semiconductor element
50' Semiconductor element wafer
70 First insulating part
70A First insulating part locally provided between adjacent metal buffer layers
70A1 Narrower region of locally provided first insulating part
70A2 Wider region of locally provided first insulating part
70' Insulating layer pattern (resin layer pattern or inorganic material layer pattern, for example)
72 Second insulating part (insulating layer)
72' Sealing layer (sealing resin layer or sealing inorganic material layer, for example)
80 Phosphor layer
85 Carrier film
90 Lens part
100 Semiconductor device
100' Precursor of semiconductor device

The invention claimed is:
1. A semiconductor device comprising:
a semiconductor element; and
a metal buffer layer, the metal buffer layer being in an electrical connection to the semiconductor element, wherein the metal buffer layer and the semiconductor element are in a connection with each other by mutual surface contact of the metal buffer layer and the semiconductor element, wherein the metal buffer layer is an external connection terminal used for a mounting with respect to a secondary mount substrate, and the metal buffer layer serves as a buffer part having a stress-relaxation effect between the semiconductor element and the secondary mount substrate, and wherein the metal buffer layer is provided such that the metal buffer layer extends beyond the semiconductor element.

2. The semiconductor device according to claim 1, wherein the metal buffer layer additionally serves as a supporting layer for supporting the semiconductor element.

3. The semiconductor device according to claim 1, wherein the metal buffer layer has a thickness of 50 µm or larger.

4. The semiconductor device according to claim 1, wherein the metal buffer layer has a locally different structure of crystal grain in which an average crystal grain size in a semiconductor element-sided region of the metal buffer layer is smaller than that of a secondary mount substrate-sided region of the metal buffer layer.

5. The semiconductor device according to claim 4, wherein the average crystal grain size in the semiconductor element-sided region of the metal buffer layer is 5 µm or lower, and wherein the average crystal grain size in the secondary mount substrate-sided region of the metal buffer layer is 10 µm or larger.

6. The semiconductor device according to claim 1, wherein the metal buffer layer comprises at least one kind of particle in a base material of the metal buffer layer.

7. The semiconductor device according to claim 6, wherein the at least one kind of particle contained in the base material of the metal buffer layer is a metal particle.

8. The semiconductor device according to claim 6, wherein the at least one kind of particle contained in the base material of the metal buffer layer is an insulating particle.

9. The semiconductor device according to claim 6, wherein a content of the at least one kind of particle differs locally in the metal buffer layer in which a particle content in a semiconductor element-sided region of the metal buffer layer is higher than that of a secondary mount substrate-sided region of the metal buffer layer.

10. The semiconductor device according to claim 7, wherein the metal buffer layer comprises the at least one kind of the particle in the base material of the metal buffer layer, and
wherein the base material of the metal buffer layer is provided as a plating material in which the at least one kind of particle is contained.

11. The semiconductor device according to claim 1, further comprising a first insulating part provided around the metal buffer layer and a second insulating part provided around the semiconductor element.

12. The semiconductor device according to claim 11, wherein the metal buffer layer and the first insulating part serve as a supporting layer.

13. The semiconductor device according to claim 11, wherein the semiconductor element includes a plurality of electrodes, and the metal buffer layer includes a plurality of metal buffer layers which are provided such that the plurality of metal buffer layers are electrically connected to the plurality of electrodes, and wherein the first insulating part is provided at least between adjacent metal buffer layers of the plurality of metal buffer layers.

14. The semiconductor device according to claim 13, wherein a local region of the first insulating part comprises two portions of a narrower region and a wider region, the local region being located between the adjacent metal buffer layers.

15. The semiconductor device according to claim 1, further comprising a reflective layer on the metal buffer layer, wherein the semiconductor element and the metal buffer layer are in connection with each other by the mutual surface contact via at least a part of the reflective layer.

16. A method for manufacturing a semiconductor device, the method comprising:
(i) providing a semiconductor element; and
(ii) forming a metal buffer layer so that the metal buffer layer is in an electrical connection to the semiconductor element, wherein, in the step (ii), the formation of the metal buffer layer is performed through mutual surface contact of the metal buffer layer and the semiconductor element, wherein the metal buffer layer is an external connection terminal used for a mounting with respect to a secondary mount substrate, and the metal buffer layer serves as a buffer part having a stress-relaxation effect between the semiconductor element and the secondary mount substrate, and wherein the metal buffer layer is provided such that the metal buffer layer extends beyond the semiconductor element.

17. The method according to claim 16, wherein, in the step (ii), a foundation for the formation of the metal buffer layer is formed on the semiconductor element, and thereafter the metal buffer layer is formed such that the metal buffer layer makes surface contact with the semiconductor element via the foundation.

18. The method according to claim 17, wherein the foundation is formed by a dry plating process and the metal buffer layer is formed by a wet plating process.

19. The method according to claim 16, wherein the semiconductor element provided in the step (i) has an insulating layer at least on a principal surface of the semiconductor element.

20. The method according to claim 19, wherein the semiconductor element has a form of a semiconductor element chip, and
wherein, in the step (i), the semiconductor element chip is disposed on a carrier film, and the insulating layer is formed on the carrier film to cover the semiconductor element chip and thereafter the carrier film is removed, and thereby the semiconductor element chip buried in the insulating layer is provided, the buried chip being flush with the insulating layer.

21. The method according to claim 16, wherein, in the step (i), the semiconductor element has a form of a semiconductor element chip, and
wherein, in the step (ii), the metal buffer layer is formed such that the metal buffer layer extends toward the outside of the semiconductor element chip.

22. The method according to claim 16, wherein the semiconductor element provided in the step (i) has a form of a semiconductor element wafer, and
wherein, in the step (ii), a plurality of the metal buffer layer is formed on the semiconductor element wafer, and wherein a cutting operation is performed in the final stage of the manufacturing of the device to divide at least one of the plurality of the metal buffer layers into two pieces.

23. The method according to claim 16, further comprising forming an insulating part around the metal buffer layer,
wherein the formation of the metal buffer layer includes two phases to form a first sub-buffer layer and to form a second sub-buffer layer, and the formation of the insulating part is performed at a point in time between the formation of the first sub-buffer layer and the formation of the second sub-buffer layer.

24. The method according to claim 23, wherein a plurality of the metal buffer layer is formed in the step (ii), and
wherein the insulating part is formed such that the insulating part bridges two neighboring metal buffer layers of the plurality of metal buffer layers, filling a space between the two neighboring metal buffer layers of the plurality of metal buffer layers.

25. The method according to claim 16, wherein, in the step (ii), a foundation for the formation of the metal buffer layer is formed on the semiconductor element, and thereafter the metal buffer layer is formed such that the metal buffer layer makes surface contact with the semiconductor element via the foundation, and
wherein the foundation is eventually used as a reflective layer of the semiconductor device.

26. A semiconductor device comprising:
a semiconductor element; and
a metal buffer layer, the metal buffer layer being in an electrical connection to the semiconductor element,
wherein the metal buffer layer and the semiconductor element are in a connection with each other by mutual surface contact of the metal buffer layer and the semiconductor element,
wherein the metal buffer layer is an external connection terminal used for a mounting with respect to a secondary mount substrate, and the metal buffer layer serves as a buffer part having a stress-relaxation effect between the semiconductor element and the secondary mount substrate, and
wherein the metal buffer layer has a locally different structure of crystal grain in which an average crystal grain size in a semiconductor element-sided region of the metal buffer layer is smaller than that of a secondary mount substrate-sided region of the metal buffer layer.

* * * * *